United States Patent
Preble et al.

(10) Patent No.: US 8,202,793 B2
(45) Date of Patent: *Jun. 19, 2012

(54) INCLUSION-FREE UNIFORM SEMI-INSULATING GROUP III NITRIDE SUBSTRATES AND METHODS FOR MAKING SAME

(75) Inventors: Edward A. Preble, Raleigh, NC (US); Denis Tsvetkov, Morrisville, NC (US); Andrew D. Hanser, Raleigh, NC (US); N. Mark Williams, Raleigh, NC (US); Xueping Xu, Stamford, CT (US)

(73) Assignee: Kyma Technologies, Inc., Raleigh, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/855,087

(22) Filed: Aug. 12, 2010

(65) Prior Publication Data

US 2011/0042682 A1    Feb. 24, 2011

Related U.S. Application Data

(63) Continuation of application No. 11/606,633, filed on Nov. 30, 2006, now Pat. No. 7,777,217.

(60) Provisional application No. 60/749,728, filed on Dec. 12, 2005, provisional application No. 60/750,982, filed on Dec. 16, 2005, provisional application No. 60/810,537, filed on Jun. 2, 2006, provisional application No. 60/843,036, filed on Sep. 8, 2006, provisional application No. 60/847,855, filed on Sep. 28, 2006.

(51) Int. Cl.
*H01L 21/28* (2006.01)
*H01L 21/3205* (2006.01)

(52) U.S. Cl. ........ 438/604; 438/478; 438/479; 438/481; 257/E21.09; 257/E21.053; 257/E21.097

(58) Field of Classification Search .......... 438/478–503, 438/602, 603, 604, FOR. 287, FOR. 264; 257/E21.09, E21.053, E21.097, E21.108, 257/E21.121, E21.131

See application file for complete search history.

(56) References Cited

U.S. PATENT DOCUMENTS 5,563,422 A    10/1996   Nakamura et al.
(Continued)

OTHER PUBLICATIONS

Balmer et al., "GaN-Based Heterojunction FET's on 100mm Si Substrates", 2.sup.nd EMRS DTC Technical Conference, Edinburgh 2005, pp. A24.

(Continued)

*Primary Examiner* — Michelle Mandala
(74) *Attorney, Agent, or Firm* — Bingham McCutchen LLP

(57) ABSTRACT

In a method for making an inclusion-free uniformly semi-insulating GaN crystal, an epitaxial nitride layer is deposited on a substrate. A 3D nucleation GaN layer is grown on the epitaxial nitride layer by HVPE under a substantially 3D growth mode, wherein a surface of the nucleation layer is substantially covered with pits and the aspect ratio of the pits is essentially the same. A GaN transitional layer is grown on the nucleation layer by HVPE under a condition that changes the growth mode from the substantially 3D growth mode to a substantially 2D growth mode. After growing the transitional layer, a surface of the transitional layer is substantially pit-free. A bulk GaN layer is grown on the transitional layer by HVPE. After growing the bulk layer, a surface of the bulk layer is smooth and substantially pit-free. The GaN is doped with a transition metal during at least one of the foregoing GaN growth steps.

12 Claims, 11 Drawing Sheets

U.S. PATENT DOCUMENTS

| | | | |
|---|---|---|---|
| 5,611,955 | A | 3/1997 | Barrett et al. |
| 5,868,837 | A | 2/1999 | DiSalvo et al. |
| 6,086,673 | A | 7/2000 | Molnar |
| 6,086,734 | A | 7/2000 | Harada |
| 6,146,457 | A | 11/2000 | Solomon |
| 6,156,581 | A | 12/2000 | Vaudo et al. |
| 6,177,688 | B1 | 1/2001 | Linthicum et al. |
| 6,255,198 | B1 | 7/2001 | Linthicum et al. |
| 6,261,929 | B1 | 7/2001 | Gehrke et al. |
| 6,265,289 | B1 | 7/2001 | Zheleva et al. |
| 6,273,948 | B1 | 8/2001 | Porowski et al. |
| 6,274,518 | B1 | 8/2001 | Yuri et al. |
| 6,380,108 | B1 | 4/2002 | Linthicum et al. |
| 6,403,451 | B1 | 6/2002 | Linthicum et al. |
| 6,413,627 | B1 | 7/2002 | Motoki et al. |
| 6,440,823 | B1 | 8/2002 | Vaudo et al. |
| 6,447,604 | B1 | 9/2002 | Flynn et al. |
| 6,468,347 | B1 | 10/2002 | Motoki et al. |
| 6,488,767 | B1 | 12/2002 | Xu et al. |
| 6,521,514 | B1 | 2/2003 | Gehrke et al. |
| 6,528,394 | B1 | 3/2003 | Lee |
| 6,533,874 | B1 | 3/2003 | Vaudo et al. |
| 6,596,079 | B1 | 7/2003 | Vaudo et al. |
| 6,608,327 | B1 | 8/2003 | Davis et al. |
| 6,616,757 | B1 | 9/2003 | Melnik et al. |
| 6,649,287 | B2 | 11/2003 | Weeks, Jr. et al. |
| 6,652,648 | B2 | 11/2003 | Park |
| 6,656,823 | B2 | 12/2003 | Lee et al. |
| 6,667,184 | B2 | 12/2003 | Motoki et al. |
| 6,686,261 | B2 | 2/2004 | Gehrke et al. |
| 6,692,568 | B2 | 2/2004 | Cuomo et al. |
| 6,693,021 | B1 | 2/2004 | Motoki et al. |
| 6,750,121 | B1 | 6/2004 | Kim |
| 6,765,240 | B2 | 7/2004 | Tischler et al. |
| 6,768,146 | B2 | 7/2004 | Yoshida |
| 6,773,504 | B2 | 8/2004 | Motoki et al. |
| 6,784,085 | B2 | 8/2004 | Cuomo et al. |
| 6,897,483 | B2 | 5/2005 | Zheleva et al. |
| 6,909,165 | B2 | 6/2005 | Nakayama et al. |
| 6,923,859 | B2 | 8/2005 | Kim |
| 6,924,159 | B2 | 8/2005 | Usui et al. |
| 6,943,095 | B2 | 9/2005 | Vaudo et al. |
| 6,951,695 | B2 | 10/2005 | Xu et al. |
| 7,012,318 | B2 | 3/2006 | Motoki et al. |
| 7,118,813 | B2 | 10/2006 | Xu et al. |
| 7,777,217 | B2 | 8/2010 | Preble et al. |
| 7,897,490 | B2 * | 3/2011 | Preble et al. .......... 438/478 |
| 2002/0068201 | A1 | 6/2002 | Vaudo et al. |
| 2002/0069816 | A1 | 6/2002 | Gehrke et al. |
| 2003/0157376 | A1 | 8/2003 | Vaudo et al. |
| 2003/0207125 | A1 | 11/2003 | Sunakawa et al. |
| 2004/0080010 | A1 | 4/2004 | Parikh et al. |
| 2004/0124434 | A1 | 7/2004 | D'Evelyn et al. |
| 2005/0009310 | A1 | 1/2005 | Vaudo et al. |
| 2005/0098095 | A1 | 5/2005 | D'Evelyn et al. |
| 2005/0103257 | A1 | 5/2005 | Xu et al. |
| 2005/0133818 | A1 | 6/2005 | Johnson et al. |
| 2005/0167775 | A1 | 8/2005 | Nagy et al. |
| 2006/0003556 | A1 | 1/2006 | Lee et al. |
| 2007/0141823 | A1 | 6/2007 | Preble et al. |

OTHER PUBLICATIONS

Otoki et al., "GaN-HEMT on 100mm Diameter Sapphire Substrate Grown by MOVPE", 2003 International Conference on Compound Semiconductor Mfg., GaAs MANTECH, Inc., pp. 1-4.
R. Beccard et al., "Growth of semi-insulating InP:Fe in the low pressure hydride VPE system", Cryst. Growth, vol. 121, pp. 373-380 (1992).
S. Porowski et al., "Thermodynamical properties of III-V nitrides and crystal growth of GaN at high N.sub.2 pressure", J. Cryst. Growth, vol. 178, pp. 174-188 (1997).
M. S. Shur, "GaN Based Transistors for High Power Applications", Solid-State Electronics, vol. 42, No. 12, pp. 2131-2138 (1998).
Kelly et al., "Large Free-Standing GaN Substrates by Hydride Vapor Phase Epitay and Laser-Induced Liftoff", Jpn J. Appl. Phys., vol. 38, pp. L217-L219 (1999).
Z. Suo, "Fracture in Thin Films", Encyclopedia of Materials: Science and Technology, Elsevier Science (Jun. 26, 2000).
Chyi et al., "Temperature dependence of GaN high breakdown voltage diode rectifiers", Solid-State Electronics, 44, pp. 613-617 (2000).
Johnson et al., "Schottky rectifiers fabricated on free-standing GaN substrates", Solid-State Electronics, 45, pp. 405-410 (2001).
Yasan et al., "Comparison of ultraviolet light-emitting diodes with peak emission at 340 nm grown on GaN substrate and sapphire", Applied Physics Letters, vol. 81, No. 12, pp. 2151-2154 (Sep. 16, 2002).
Akita et al., "Advantages of GaN Substrates in InAlGaN Quaternary Ultraviolet-Light-Emitting Diodes", Japanese Journal of Applied Physics, vol. 43, No. 12, pp. 8030-8031 (2004).
B. Monemar et al., "Growth of thick GaN layers with hydride vapour phase epitaxy", J. Crystal Growth 281, pp. 17-31 (2005).
S. Tomiya et al., "Structural Defects related issues of GaN-based Laser Diodes", Mater. Res. Soc. Symp. Proc., vol. 831, pp. E1.1.1-E1.1.11 (2005).
A. Corrion et al., "Growth of Fe-doped GaN by RF plasma-assisted molecular beam epitaxy", Journal of Crystal Growth, vol. 289, pp. 587-595 (2006).
Yoshida et al., "Improvements on the electrical and luminescent properties of reactive molecular beam epitaxially grown GaN films by using AlN-coated sapphire substrates", Appl. Phys. Lett., 42 (5), pp. 427-429 (Mar. 1, 1983).
Amano et al., "Metalorganic vapor phase epitaxial growth of a high quality GaN film using an AlN buffer layer", Appl. Phys. Lett., 48 (5), pp. 353-355 (Feb. 3, 1986).
S. Nakamura, "GaN Growth Using GaN Buffer Layer", Jpn. J. Appl. Phys., vol. 30, No. 10A, pp. L1705-L1707 (Oct. 1991).
Strite et al., "GaN, AlN, and InN: A review", J. Vac. Sci. Technol., B 10(4), 1237-1266 (Jul./Aug. 1992).
J. Baur et al., "Infrared luminescence of residual iron deep level acceptors in gallium nitride (GaN) epitaxial layers", Applied Physics Letters, vol. 64, No. 7, pp. 857-859 (Feb. 14, 1994).
Lester et al., "High dislocation densities in high efficiency GaN-based light-emitting diodes", Appl. Phys. Lett. 66 (10), pp. 1249-1251 (Mar. 6, 1995).
Nakamura et al., "Superbright Green InGaN Single-Quantum-Well-Structure Light-Emitting Diodes", Jpn. J. Appl. Phys., vol. 34, Part 2, No. 10B, pp. L1332-L1335 (Oct. 15, 1995).
Rosner et al., "Correlation of cathodoluminescence inhomogeneity with microstructural defects in epitaxial GaN grown by metalorganic chemical-vapor deposition", Appl. Phys. Lett., 70 (4), pp. 420-422 (Jan. 1997).
R. Heitz et al., "Excited states of Fe.sup.3+ in GaN", Physical Review B, vol. 55, No. 7, pp. 4382-4387 (Feb. 15, 1997).
Sugiura, "Dislocation motion in GaN light-emitting devices and its effect on device lifetime", J. Appl. Phys., 81 (4), pp. 1633-1638 (Feb. 15, 1997).
Nakamura et al., "Room-temperature continuous-wave operation of InGaN multi-quantum-well structure laser diodes with a lifetime of 27 hours", Appl. Phys. Lett., 70 (11), pp. 1417-1419 (1997).
Weimann et al., "Scattering of electrons at threading dislocations in GaN", J. Appl. Phys., vol. 83, No. 7, pp. 3656-3659 (Apr. 1, 1998).
Ng et al., "The role if dislocation scattering in n-type GaN films", Appl. Phys. Lett., vol. 73, No. 6, pp. 821-823 (Aug. 10, 1998).
Look et al., "Dislocation Scattering in GaN", Phys. Rev. Lett., vol. 82, No. 6, pp. 1237-1240 (Feb. 8, 1999).
Rosner et al., "Cathodoluminescence mapping of epitaxial lateral overgrowth in gallium nitride", Appl. Phys. Lett., vol. 74, No. 14, pp. 2035-2037 (Apr. 5, 1999).
Trivedi et al., "Performance evaluation of high-power wide band-gap semiconductor rectifiers", J. Appl. Phys., vol. 85, No. 9, pp. 6889-6897 (May 1, 1999).
N. I. Kuznetsov et al., "Insulating GaN:Zn layers grown by hydride vapor phase epitaxy on SiC substrates", Applied Physics Letters, vol. 75, No. 20, pp. 3138-3140 (Nov. 15, 1999).
Misra et al., "Investigation of vertical transport in n-GaN films grown by molecular beam epitaxy using Schottky barrier diodes", Appl. Phys. Lett., vol. 76, No. 8, pp. 1045-1047 (Feb. 21, 2000).

Polyakov et al., "Electrical properties and defect states in undoped high-resistivity GaN films used in high-power rectifiers", J. Vac. Sci. Technol., B 18(3), pp. 1237-1243 (May/Jun. 2000).

Dang et al., "High breakdown voltage Au/Pt/GaN Schottky diodes", J. Vac. Sci. Technol., A 18(4), pp. 1135-1138 (Jul./Aug. 2000).

Karrer et al., "Influence of crystal polarity on the properties of Pt/GaN Schottky diodes", Appl. Phys. Lett., vol. 77, No. 13, pp. 2012-2014 (Sep. 22, 2000).

Pearton et al., "Fabrication and performance of GaN electronic devices", Materials Science and Engineering, R30, pp. 55-212 (2000).

Etzkorn et al., "Cracking of GaN Films", J. Appl. Phys., vol. 89, No. 2, pp. 1025-1034 (Jan. 15, 2001).

Zhang et al., "Vertical and lateral GaN rectifiers on free-standing GaN substrates", Applied Physics Letters, vol. 79, No. 10, pp. 1555-1557 (Sep. 3, 2001).

Shin et al., "Superior Characteristics of $RuO_2$/GaN Schottky-Type UV Photodetector", Phys. Stat. Sol. A, 188, No. 1, pp. 341-344 (2001).

Karpov et al., "Dislocation effect on light emission efficiency in gallium nitride", Applied Physics Letters, vol. 81, No. 25, pp. 4721-4723 (Dec. 16, 2002).

Johnson et al., "Breakdown Voltage and Reverse Recovery Characteristics of Free-Standing GaN Schottky Rectifiers", IEEE Transactions on Electronic Devices, vol. 49, No. 1, pp. 32-36 (2002).

S. Heikman, "Growth of Fe doped semi-insulating GaN by metalorganic chemical vapor deposition", Applied Physics Letters, vol. 81, No. 3, pp. 439-441 (Jul. 15, 2002).

Katz et al., "Anisotropy in detectivity of GaN Schottky ultraviolet detectors: Comparing lateral and vertical geometry", Appl. Phys. Lett., vol. 80, No. 3, pp. 347-349 (2002).

Baik et al., "160-A bulk GaN Schottky diode array", Appl. Phys. Lett., vol. 83, No. 15, pp. 3192-3194 (2003).

Kang et al., "Temperature dependent characteristics of bulk GaN Schottky rectifiers on free-standing GaN substrates", J. Vac. Sci. Technol., B 22(2), pp. 710-714 (2004).

Walters, "Rectifier Reverse Switching Performance", MicroNote Series 302, Microsemi, 3 pgs.

Office Action dated Apr. 15, 2009 for related U.S. Appl. No. 10/606,624, 20 pgs.

\* cited by examiner

INCLUSION-FREE UNIFORM SEMI-INSULATING GROUP III NITRIDE SUBSTRATES AND METHODS FOR MAKING SAME

CROSS-REFERENCE TO RELATED APPLICATIONS

This application is a continuation of U.S. patent application Ser. No. 11/606,633, filed Nov. 30, 2006, which claims the benefit of and priority to U.S. Provisional Application Ser. No. 60/749,728, filed Dec. 12, 2005, U.S. Provisional Application Ser. No. 60/750,982, filed Dec. 16, 2005, U.S. Provisional Application Ser. No. 60/810,537, filed Jun. 2, 2006, U.S. Provisional Application Ser. No. 60/843,036, filed Sep. 8, 2006, and U.S. Provisional Application Ser. No. 60/847,855, filed Sep. 28, 2006. The entire disclosures of each of these applications are incorporated herein by reference.

FEDERALLY SPONSORED RESEARCH

This invention was made with government support under grant number N00164-04-C-6066 by the Missile Defense Agency ("MDA"). The United States Government has certain rights in the invention.

BACKGROUND

1. Field of the Invention

This invention relates to inclusion-free, uniform, semi-insulating gallium nitride (Al, Ga, In)N substrates, and methods for making the same. The semi-insulating GaN substrate of the invention is useful for the manufacture of electronic devices.

2. Description of the Related Art

Group III-V nitride compounds such as aluminum nitride (AlN), gallium nitride (GaN), indium nitride (InN), and alloys such as AlGaN, InGaN, and AlGaInN, are direct bandgap semiconductors with a bandgap energy ranging from about 0.6 eV for InN to about 6.2 eV for AlN. These materials can be used to produce light emitting devices such as light emitting diodes (LEDs) and laser diodes (LDs). The material properties of the III-V nitride compounds are also suitable for fabrication of electronic devices that can be operated at higher temperatures, higher powers, and higher frequencies than conventional devices based on silicon (Si) or gallium arsenide (GaAs).

Most of the III-V nitride devices are grown on foreign substrates such as sapphire ($Al_2O_3$) and silicon carbide (SiC) because of the lack of available low-cost, high-quality, large-area native substrates such as GaN substrates. Blue LEDs are mostly grown on insulating sapphire substrates or conductive silicon carbide substrates. Because of the large mismatch in both the thermal expansion coefficients and the lattice constants of the foreign substrate and the GaN film, there are problems associated with the foreign substrates, such as a high defect density, that lead to short device lifetime and bowing of GaN/heteroepitaxial substrate structures. Bowing leads to difficulty in fabricating devices with small feature sizes.

Conductive GaN substrates have recently become available (for example, the conductive GaN substrates that are commercially available from Sumitomo Electric, Inc.). Such conductive GaN substrates are advantageously employed in the manufacturing of blue and UV lasers. However, in a number of electronic applications such as high electron mobility transistors (HEMTs), an insulating or semi-insulating GaN substrate is highly desirable.

Unintentionally doped GaN exhibits n-type conductivity due to the presence of residual n-type impurities as well as crystal defects. Since GaN has a high bandgap energy, a pure and defect-free GaN material should exhibit insulating or semi-insulating electric properties. However, current GaN crystal growth techniques still allow the unintentional incorporation of impurities and various crystal defects such as vacancies and dislocations, which render the GaN crystals conductive.

It is known in the prior art that by introducing deep-level compensating impurities in the crystal, a wide bandgap semiconductor can be made semi-insulating. For example, U.S. Pat. No. 5,611,955 issued to Barrett et al. discloses the use of vanadium doping in silicon carbide to produce a semi-insulating SiC crystal. Similarly, Beccard et al. disclose the use of iron chloride formed by reacting elemental iron with gaseous hydrochloric acid in a vapor phase reactor during the HVPE growth of indium phosphide (InP) to produce iron-doped semi-insulating InP crystals (R. Beccard et al., J. Cryst. Growth, Vol. 121, page 373-380, 1992). The compensating impurities act as deep-level acceptors to trap the otherwise free electrons generated by unintentionally doped n-type impurities and crystal defects. The concentration of the deep-level acceptor is typically higher than the concentration of the free electrons generated by the n-type impurities and crystal defects.

Several deep-level acceptors generated by compensating impurities in gallium nitride (GaN) have been identified in the prior art. For example, Group II metals such as Be, Mg, and Zn, and transition metals such as Fe and Mn, can be incorporated in the GaN crystal resulting in semi-insulating electric properties. The energy level of iron in gallium nitride is well-documented and iron incorporation can result in gallium nitride exhibiting the semi-insulating electric property (see, for example, R. Heitz et al., Physical Review B, Vol. 55, page 4382, 1977). Iron-doped gallium nitride thin films can be grown with metal-organic chemical vapor deposition, molecular beam epitaxy, and hydride vapor phase epitaxy (see, for example, J. Baur et al., Applied Physics Letters, Vol. 64, page 857, 1994; S. Heikman, Applied Physics Letters, Vol. 81, page 439, 2002; and A. Corrion, et al., Journal of Crystal Growth, Vol. 289, page 587, 2006). Zinc-doped gallium nitride thin films grown by hydride vapor phase epitaxy can be semi-insulating as well (N. I. Kuznetsov et al., Applied Physics Letters, Vol. 75, page 3138, 1999).

U.S. Pat. No. 6,273,948 issued to Porowski et al. discloses a method of making a highly resistive GaN bulk crystal. The GaN crystal is grown from molten gallium under an atmosphere of high-pressure nitrogen (0.5-2.0 GPa) and at high temperature (1300-1700° C.). When pure gallium is used, the GaN crystal grown is conductive due to residual n-type impurities and crystal defects. When a mixture of gallium and a Group II metal such as beryllium, magnesium, calcium, zinc, or cadmium is used, the grown GaN crystal is highly resistive, with a resistivity of $10^4$-$10^8$ ohm-cm. However, the crystals obtained from molten gallium under the high-pressure, high-temperature process were quite small, on the order of one centimeter, which is not suitable for most commercial electronic applications.

U.S. Patent Application Publication No. 2005/0009310 by Vaudo et al. discloses a large-area semi-insulating GaN substrate grown by hydride vapor phase epitaxy (HVPE). Typically, undoped HVPE-grown GaN is of n-type conductivity due to the residual impurities and crystal defects. By introducing a deep-level doping species during the growth process and at a sufficiently high concentration of the dopant species in the GaN crystal, the grown GaN crystal becomes semi-insulating. Typical dopant species are transitional metals such as iron.

However, during the HVPE growth of single-crystal GaN, there are various surface morphologies observed and these different growth morphologies have different levels of impurity incorporation. U.S. Pat. No. 6,468,347 by Motoki et al. discloses that in the growth of GaN on c-plane substrate by HVPE, the growth surface has inverse pyramidal pits. Because of the presence of the pits on the growing GaN surface, the actual GaN growth takes place both on the non-pitted area, which is normal c-plane growth, and on the faces of the pits, which is non-c-plane growth. U.S. Pat. No. 6,773,504 and No. 7,012,318 by Motoki et al. disclose that GaN growth on the surfaces other than the c-plane has much higher oxygen incorporation.

The presence of inverse pyramidal pits on the GaN crystal surface during HVPE growth results in a non-uniform distribution of n-type impurity concentration in the GaN crystal due to higher impurity incorporation on the non-c-plane surfaces. The impurity concentrations in these pitted areas can be an order of magnitude or more higher than in non-pitted areas. Even when compensating deep-level impurities such as iron are introduced during the crystal growth, the electric characteristics of the grown GaN crystal are not uniform when pits are present during the growth, and GaN wafers made from such crystals will have a non-uniform sheet resistance across the wafer surface. When the as-grown GaN is polished to remove the pits and to produce a smooth surface, the impurity concentration on the surface is still not uniform. The areas where pits were present have a higher oxygen impurity concentration, appear to be darker in color than the surrounding area, and are considered as "inclusions" of more conductive spots. Electronic devices grown on substrates with non-uniform electric properties have lower performance, resulting in lower device yield. Substrates that are "inclusion-free," or those substrates without non-uniform areas of more conductive spots, would have a more uniform sheet resistance across the wafer surface and higher performance, resulting in higher device yield.

Therefore, there is a compelling need in the art for large-area, inclusion-free, uniform semi-insulating GaN substrates and methods for making such substrates.

SUMMARY

The present invention generally relates to inclusion-free, semi-insulating gallium nitride (Al, Ga, In)N articles (e.g., crystals, substrates, wafers, etc.) and methods for growing such articles.

According to one implementation, a method is provided for making an inclusion-free uniformly semi-insulating GaN crystal. An epitaxial nitride layer is deposited on a single-crystal substrate. A 3D nucleation GaN layer is grown on the epitaxial nitride layer by HVPE under a substantially 3D growth mode, wherein a surface of the nucleation layer is substantially covered with pits and the aspect ratio of the pits is essentially the same. A GaN transitional layer is grown on the 3D nucleation layer by HVPE under a condition that changes the growth mode from the substantially 3D growth mode to a substantially 2D growth mode. After growing the transitional layer, a surface of the transitional layer is substantially pit-free. A bulk GaN layer is grown on the transitional layer by HVPE under the substantially 2D growth mode. After growing the bulk layer, a surface of the bulk layer is smooth and substantially pit-free. The GaN is doped with a transition metal during at least one of the foregoing GaN growth steps.

According to another implementation, an inclusion-free uniformly semi-insulating GaN crystal is provided, which is produced according to the foregoing method.

According to another implementation, a GaN/substrate bi-layer is formed according to the foregoing method. The GaN/substrate bi-layer is cooled from a growth temperature at which the bulk layer is grown to an ambient temperature, wherein GaN material of the bi-layer separates from the substrate to form a substantially crack-free free-standing GaN article.

According to another implementation, an inclusion-free uniformly semi-insulating free-standing GaN article is provided, which is produced according to the foregoing method.

According to another implementation, a method is provided for making an inclusion-free uniformly semi-insulating GaN substrate. A c-plane GaN seed substrate is provided. An epitaxial GaN boule is grown on the seed substrate by HVPE in a reactor. The growth mode is a substantially 2D growth mode and a surface of the growing GaN boule is smooth and pit-free. A volatile iron compound is flowed into the reactor. The GaN boule is sliced into a plurality of wafer blanks. The wafer blanks are polished to form a plurality of epi-ready GaN substrates.

According to another implementation, a semi-insulating GaN substrate is provided, in which the sheet resistance is uniformly greater than $1 \times 10^5$ ohm/square as measured with a non-contact eddy-current based sheet resistance mapping system such as the Lehighton method.

According to another implementation, a semi-insulating GaN substrate is provided, in which the resistivity is greater than about $1 \times 10^7$ ohm-cm.

According to another implementation, a semi-insulating GaN substrate is provided, in which the density of brown-spot inclusions is less than about $1$ cm$^{-2}$.

Other aspects, features and embodiments of the invention will be more fully apparent from the ensuing disclosure and appended claims.

DETAILED DESCRIPTION

Figure 1:
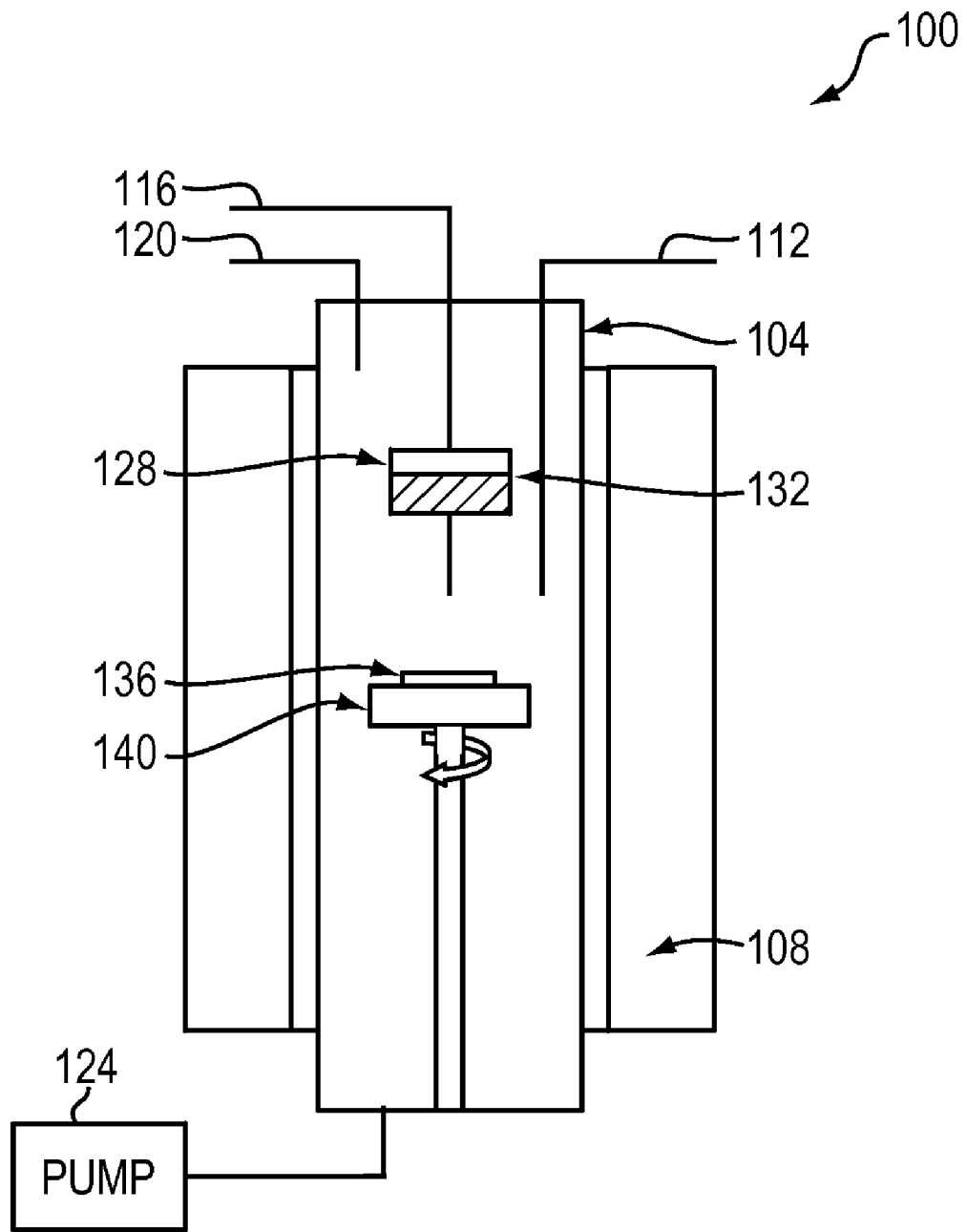
FIG. 1 is a schematic view of a vertical HVPE reactor.

Throughout the disclosure, unless specified otherwise, certain terms are used as follows. "Single crystalline film" or "single crystal" means a crystalline structure that can be characterized with x-ray rocking curve measurement. The narrower the peak of the rocking curve, the better the crystal quality. "Single crystal" does not necessarily mean that the whole crystal is a single grain; it may contain many crystalline grains with orientation more or less aligned. "Polycrystalline film" or "polycrystal" means that a crystal has many grains whose crystal orientations are randomly distributed. An X-ray rocking curve measurement of a polycrystalline film does not exhibit a peak. "Microcracks" are a cluster of localized cracks with high density of cracks. The distance between the parallel cracks in the microcrack cluster is typically less than 100 microns. "Growth cracks" are the cracks formed during crystal growth. "Cool down cracks" or "thermal cracks" are the cracks formed after the crystal growth and during the cooling of the crystal from the growth temperature to ambient or room temperature. "Pits" are typically inverse pyramidal pits on the crystal surface. "Pit-free surface" is a surface essentially having no pits on its surface. "2D growth mode" means that a growth surface remains planar and smooth during the growth. "3D growth mode" means that growth a surface develops non-planar, three-dimensional features such as pits during the growth. "Pitted surface morphology" means a surface having a substantial amount of pits on its surface. Pitted surface morphology is related to the 3D growth mode. "Smooth surface morphology" means that a surface is specular and has no visual defects (such as pits). Smooth surface morphology is related to the 2D growth mode. "Nucleation layer" in some implementations may be the layer first grown on a substrate. In other implementations, a "template layer" may be the layer first grown on a substrate. "Bulk layer" is where the majority of the crystal is grown. "V:III ratio" in some implementations is the ratio of the ammonia flow to the HCl flow used during a hydride vapor phase epitaxy GaN growth process. "Ammonia partial pressure" is calculated according to the ammonia flow, the total gas flow into a reactor, and the reactor pressure. "Growth surface" or "growing surface" or "growth front" is the surface of the crystal during the instance of the growth. "Semi-insulating" (SI) defined as the resistivity measured at room temperature equal to or greater than $1 \times 10^5$ ohm-cm.

For purposes of the present disclosure, it will be understood that when a layer (or film, region, substrate, component, device, or the like) is referred to as being "on" or "over" another layer, that layer may be directly or actually on (or over) the other layer or, alternatively, intervening layers (e.g., buffer layers, transition layers, interlayers, sacrificial layers, etch-stop layers, masks, electrodes, interconnects, contacts, or the like) may also be present. A layer that is "directly on" another layer means that no intervening layer is present, unless otherwise indicated. It will also be understood that when a layer is referred to as being "on" (or "over") another layer, that layer may cover the entire surface of the other layer or only a portion of the other layer. It will be further understood that terms such as "formed on" or "disposed on" are not intended to introduce any limitations relating to particular methods of material transport, deposition, fabrication, surface treatment, or physical, chemical, or ionic bonding or interaction.

Unless otherwise indicated, terms such as "gallium nitride" and "GaN" are intended to describe binary, ternary, and quaternary Group III nitride-based compounds such as, for example, gallium nitride, indium nitride, aluminum nitride, aluminum gallium nitride, indium gallium nitride, indium aluminum nitride, and aluminum indium gallium nitride, and alloys, mixtures, or combinations of the foregoing, with or without added dopants, impurities or trace components, as well as all possible crystalline structures and morphologies, and any derivatives or modified compositions of the foregoing. Unless otherwise indicated, no limitation is placed on the stoichiometries of these compounds.

Large-area GaN substrates can be made by growing thick GaN films on foreign substrates, followed by separation of the film from the substrate. Prior art in U.S. Pat. Nos. 6,413, 627; 6,468,347; 6,667,184; 6,693,021; 6,773,504; and 6,909, 165 teaches methods for making a bulk GaN substrate by first growing a GaN film on a gallium arsenide (GaAs) substrate by hydride vapor phase epitaxy (HVPE) and subsequently removing the GaAs substrate by etching or grinding. Prior art in U.S. Pat. Nos. 6,440,823; 6,528,394; 6,596,079; 6,652, 648; 6,750,121; 6,765,240; 6,923,859; and U.S. Pat. App. Pub. Nos. 2002/0068201; 2005/0103257; and 2005/0009310 teaches methods for making a bulk GaN substrate by first growing a GaN film on a sapphire substrate, followed by separating the grown GaN from the sapphire by, for example, laser-induced separation.

Typically, single-crystal GaN films can be grown on sapphire substrates through the introduction of a buffer layer between the substrate and GaN film. In the molecular beam epitaxy (MBE) and metal-organic vapor phase epitaxy (MOVPE) growth of GaN films on sapphire, a low-temperature buffer layer is typically needed in order to grow high-quality GaN films. It is not clear whether a buffer layer is needed for hydride vapor phase epitaxy (HVPE) GaN growth on sapphire. Lee in U.S. Pat. No. 6,528,394 discloses a specific method of pre-treatment for growing GaN on sapphire using HVPE. The pre-treatment involves etching sapphire with gas mixture of hydrochloric acid (HCl) and ammonia ($NH_3$), as well as nitridation of the sapphire substrate. Molnar in U.S. Pat. No. 6,086,673 discloses the use of zinc oxide (ZnO) pretreatment layer that was further reacted in the gaseous environment of HCl and/or $NH_3$. After this treatment of the sapphire substrate, single-crystal GaN film is then grown by HVPE. On the other hand, Vaudo et al. in U.S. Pat. No. 6,440,823 discloses the growth of a low defect density GaN layer on sapphire by an HVPE method, without using any buffer layers or nucleation layers.

Since teachings in the prior art regarding sapphire substrate treatment or initiation prior to HVPE GaN growth are in conflict, we systematically investigated the growth of gallium nitride film on sapphire using an HVPE process. Vertical HVPE reactors were used for the investigation. FIG. 1 schematically illustrates an example of a vertical HVPE reactor 100. The HVPE reactor 100 includes a quartz reactor tube 104 that is heated by a multi-zone furnace 108. The reactor tube 104 is connected to gas inlets 112, 116, and 120 for introducing reactants, carrier gases, and diluting gases. The reactor tube 104 is also connected to a pump and exhaust system 124. In some implementations, inside the reactor 100, gaseous hydrochloric acid (HCl) is flowed through a vessel 128 containing gallium metal 132, which is at a temperature of, for example, about 850° C. The hydrochloric acid reacts with the gallium metal 132, forming gaseous GaCl, which is transported by a carrier gas, such as nitrogen, to the deposition zone in the reactor tube 104. Ammonia ($NH_3$) and an inert diluent gas, such as nitrogen, are also flowed to the deposition zone where GaN crystals are deposited. The reactor 100 is designed such that the mixing of GaCl and $NH_3$ does not occur near the gas outlets, ensuring no deposition of GaN on the outlets of GaCl and $NH_3$ and enabling long-term stability of gas flow patterns. Epi-ready c-plane sapphire substrates or other suitable substrates 136 may be used. The sapphire substrate 136 is placed on a rotating platter 140, and heated to a temperature of, for example, 900-1100° C.

A typical deposition run process is as follows: (1) a sapphire substrate 136 is placed on the platter 140, (2) the reactor 100 is sealed, (3) the reactor 100 is evacuated and purged with high-purity nitrogen to remove any impurities from the system, (4) the platter 140 with the substrate 136 is raised to the deposition zone, (5) the platter temperature is controlled at the desired deposition temperature, (6) ammonia is flowed into the reactor 100, (7) HCl is flowed to the reactor 100 to start the GaN deposition, (8) deposition proceeds according to a predetermined recipe for a predetermined time, (9) the HCl and $NH_3$ gas flows are stopped, (10) the platter 140 is lowered and the grown crystal is gradually cooled down, and (11) the grown crystal is removed for characterization and further processing.

After systematically investigating the HVPE growth of GaN on sapphire substrates, we found that without a suitable buffer layer or pretreatment, GaN films grown under the conditions taught by the prior art were not single-crystalline films. In fact, they were polycrystalline GaN films. We wish not to be bound by any particular theory regarding the various results of HVPE GaN crystal growth on sapphire, but the discrepancy in the various prior-art work and our own work may be related to particular reactor configurations or surface treatments. The prior art did not teach a reproducible method to grow single-crystal GaN films on sapphire substrates by HVPE.

There is a large lattice mismatch between sapphire and gallium nitride. Furthermore, c-plane GaN is a polar crystal, i.e., one face is terminated with gallium and the opposite face of the crystal is terminated with nitrogen. On the other hand, sapphire is not a polar crystal; the c-plane of sapphire is terminated with oxygen on both faces. In other GaN thin-film deposition techniques such as molecular beam epitaxy (MBE) or metal-organic vapor phase epitaxy (MOVPE), a thin buffer layer is required for high-quality single-crystalline GaN growth. The buffer layer may be an AlN layer (S. Yoshida et al., Appl. Phys. Lett. 42, 427 (1983); H. Amano et al., Appl. Phys. Lett. 48, 353 (1986)) or a GaN layer grown at low temperature (S. Nakamura, Jpn. J. Appl. Phys., 30, L1705 (1991)). Lee in U.S. Pat. No. 6,528,394 postulated the formation of a thin AlN layer on the sapphire surface by the pretreatment step prior to HVPE GaN growth.

U.S. Pat. No. 6,784,085, the entire contents of which are incorporated by reference herein, discloses a high-temperature reactive sputtering method for growing high-quality AlN film on sapphire substrates. Using this method, we coated sapphire substrates with AlN for use as substrates for HVPE GaN growth.

High-quality GaN thin films were successfully and reproducibly grown on the AlN-coated sapphire substrate. We first grew a thin layer of AlN film on a sapphire substrate by sputtering using the method disclosed in U.S. Pat. No. 6,784,085. The thickness of the AlN layer was about 0.5-2 microns. X-ray rocking curve measurement indicated the AlN film was epitaxial single-crystalline film with (0002) rocking curve full width at half maximum (FWHM) of 50 arcsec. The thin GaN films grown on the AlN-coated sapphire substrates under typical HVPE conditions are single-crystalline films.

After developing a thin-film growth process for growing single-crystalline GaN films on AlN sputter-coated sapphire substrates, we investigated the growth of thicker GaN films. We discovered another problem, namely, microcracking in the GaN films. Under typical HVPE growth conditions that are considered desirable in the prior art, the GaN film is transparent with a smooth surface morphology. The thin HVPE GaN film, typically thinner than 5 microns, is crack-free. However, when we grew the film thicker, typically thicker than 10 microns under the typical growth conditions taught by the prior art, we found that there are many cracks (microcracks) present in the GaN film, but with none in the sapphire substrate. We then sought to understand the origin of these cracks.

Because of the difference between the coefficients of thermal expansion of the sapphire substrate and the GaN film, thermal stress builds up when the film cools down from the typical growth temperature of about 1000° C. to ambient room temperature. As discussed in open literature (for example, E. V. Etzkorn and D. R. Clarke, "Cracking of GaN Films," J. Appl. Phys., 89 (2001) 1025), sapphire substrate shrinks faster than GaN film during cool down, causing a compressive stress in the GaN film due to this thermal expansion mismatch. The compressive thermal stress in the GaN film should not cause microcracking in the GaN film during cool down. Therefore, the microcracks must be already formed during the GaN growth and prior to cool down.

The microcracking of the GaN film during the growth suggests a tensile stress in the GaN film during the growth. We wish not be bound by any particular theory regarding the origin of microcracking during GaN growth. However, the tensile stress may be related to the AlN layer employed in the study, or may be related to the HVPE growth condition used, or may be universal to the HVPE GaN growth in general. While cracking is noted in some instances, most prior-art teachings in HVPE GaN growth do not disclose the formation of microcracks in GaN film during growth. The prior art also does not teach how to eliminate the microcracks during the HVPE GaN growth.

In order to eliminate the microcracks formed during the HVPE GaN growth, we systematically investigated GaN growth on the AlN-coated sapphire under various growth conditions by varying growth parameters, such as GaCl flow or partial pressure (which may be determined by the flow of hydrochloric acid (HCl)), $NH_3$ flow or partial pressure, growth temperature, and associated variables such as growth rate and V:III ratio (e.g., $NH_3$/HCl ratio). In this example, the V:III ratio is the ratio of the $NH_3$/HCl flow. The growth rate is typically proportional to GaCl partial pressure, which is directly related to the HCl flow. We found that the surface morphology varies substantially with the growth temperature, growth rate, and ammonia partial pressure (or V:III ratio). If the "optimal" HVPE GaN growth condition is defined as the condition that yields a smooth, crack-free, thin GaN film (e.g., equal to or less than 3 microns thick) on the AlN-coated sapphire substrate, a thick GaN film (e.g., equal to or greater than 20 microns thick) grown under such "optimal" condition is microcracked. The GaN film, grown under a condition with higher growth temperature and/or lower V:III ratio than the "optimal" growth condition, has a higher density of cracking. On the other hand, the GaN film, grown under a condition with slightly lower growth temperature and/or higher V:III ratio, is crack-free but with macroscopic pits on the surface.

Figure 2:
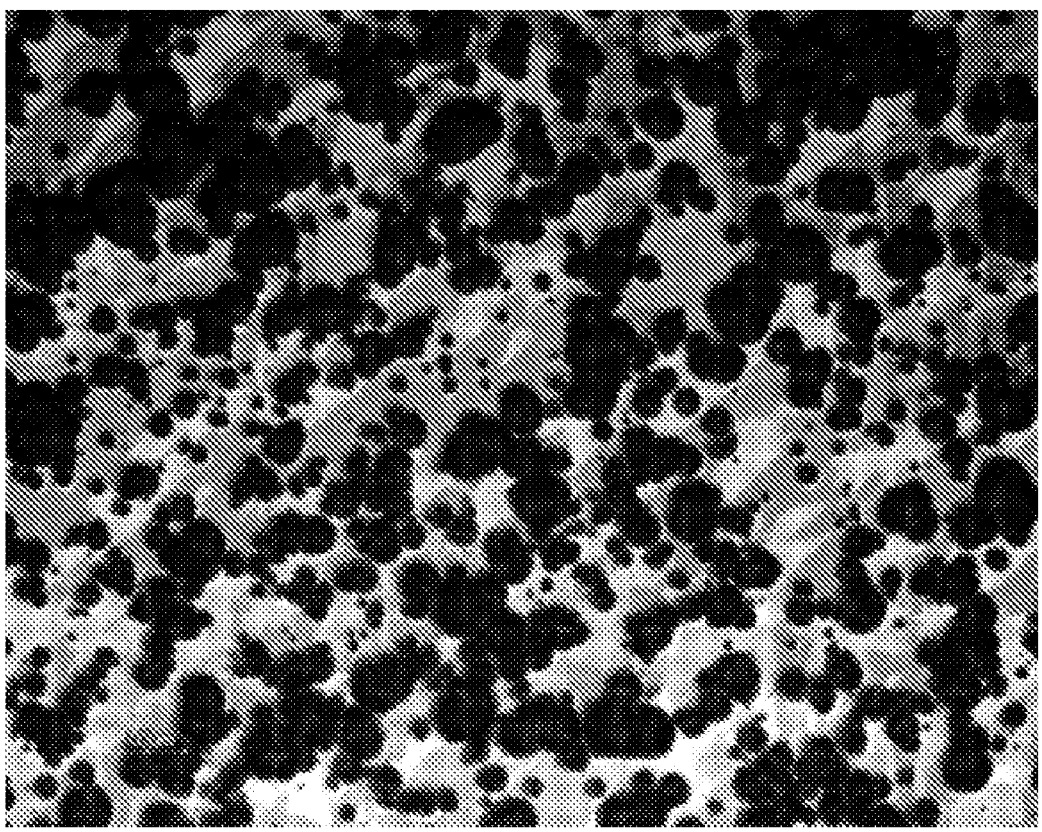
FIG. 2 is an optical micrograph of a crack-free but pitted single-crystal GaN film grown on sapphire under the following conditions: growth rate 320 microns per hour, growth temperature 990° C., and V:III ratio 58. The GaN film thickness is about 100 microns.

FIG. 2 is an optical micrograph of the surface of a single-crystal GaN film grown with higher V:III ratio than the "optimal" growth condition. The GaN film was about 100 microns thick and the surface is covered with pits of about 10 to 80 microns in diameter. Although the GaN film surface is covered with pits, the film is still an epitaxial single-crystalline film, as confirmed by x-ray rocking curve measurement, with FWHM of 400 arcsec. The larger FWHM value of the film is due in part to curvature of the sample, which is known to broaden the x-ray diffraction peak.

Figure 3:
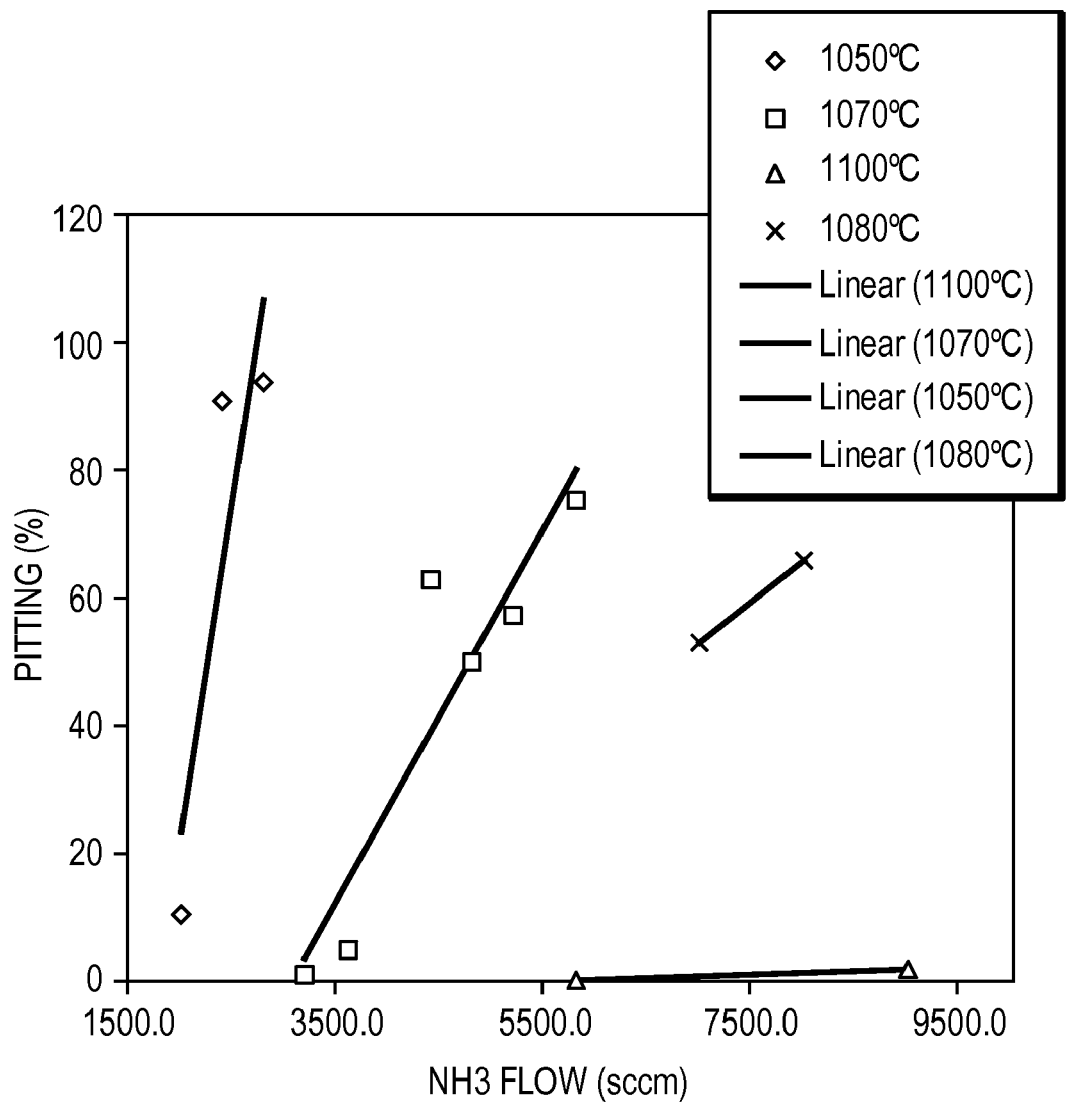
FIG. 3 illustrates plots of the pitting percentage, defined as the percentage of area covered with pits on GaN film, versus NH$_3$ flow, for furnace temperatures between 1050° C. and 1100° C. The HCl flow rate was 120 sccm and the growth rate was about 300 microns per hour. The thickness of the films was about 100 microns.

Since the pitted surface morphology eliminates the microcracks in the GaN film during the growth, we extensively studied the growth conditions that could yield pitted morphology. Furthermore, we defined a pitting percentage as the percentage of the surface area covered with pits. Typically for a 100-micron thick GaN film grown under constant conditions on an AlN-coated sapphire substrate, a pitting percentage greater than 30% in the GaN film eliminates the growth microcracks. We evaluated pitting percentage as a function of growth $NH_3$ partial pressure for several growth temperatures. FIG. 3 illustrates pitting percentage for 100-micron thick GaN films grown on AlN-coated sapphire substrates versus the $NH_3$ flow for furnace temperatures ranging from 1050° C. to 1100° C. The growth rate for this study was about 300 microns per hour and the film thickness was about 100 microns. At lower growth temperature, a slight change in $NH_3$ partial pressure leads to a large change in the pitting percentage, whereas at higher growth temperature, a change in $NH_3$ partial pressure change leads to a lesser change in pitting percentage. This indicates that growth morphology is more sensitive to the $NH_3$ partial pressure at lower temperature than at higher growth temperature.

U.S. Provisional Patent Application Ser. No. 60/750,982, filed Dec. 16, 2005, titled "METHOD OF PRODUCING FREESTANDING GALLIUM NITRIDE BY SELF-SEPARATION," which is incorporated by reference herein in its entirety, discloses a method for making GaN substrates based on this discovery of preventing GaN film microcracking during growth by using a growth condition that yields a pitted surface morphology. The method comprises several growth steps, including depositing an epitaxial nitride layer on a substrate, growing a thin GaN layer on the nitride-coated substrate under a 3D growth mode that results in a surface covered with pits, growing a transitional GaN layer on the 3D growth layer to recover from a heavily pitted surface morphology to a less pitted surface morphology, and growing a bulk layer on the recovery layer. The GaN crystal cracks laterally and separates from the substrate by itself during cooling from the growth temperature down to room temperature.

An example of this GaN growth method will now be described with reference to FIG. 4, which schematically illustrates a GaN crystal structure 400, and FIG. 5, which schematically illustrates a GaN crystal/substrate bi-layer 500 after self-separation.

Figure 4:
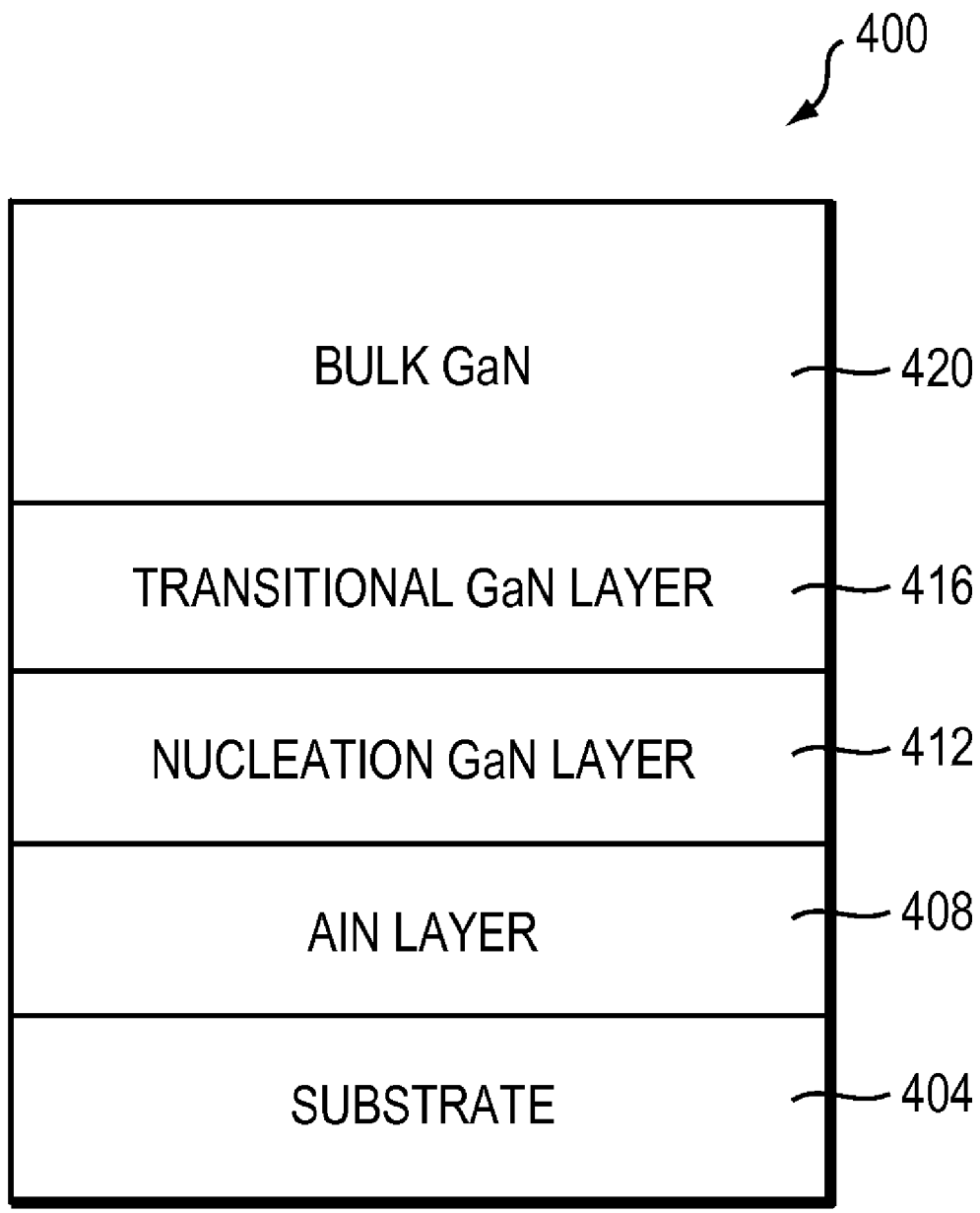
FIG. 4 is a schematic view of a GaN crystal structure that includes a bulk GaN crystal grown on a substrate, showing different layers of the crystal structure.

Referring to FIG. 4, a suitable substrate 404 is provided. In some implementations, the substrate 404 may have a characteristic dimension (e.g., diameter) of about 2 inches or greater. As further examples, the diameter of the substrate 404 may be about 3" or greater, about 4" or greater, or any other suitable size such as about 12" or greater. The substrate 404 may be sapphire ($Al_2O_3$), although other suitable single-crystal substrates 404 may be utilized. Non-limiting examples of suitable substrates 404 include sapphire, silicon carbide, gallium arsenide, zinc oxide, silicon, spinel, lithium gallate, lithium aluminate, etc.

The first step of the growth process is to deposit a thin epitaxial nitride layer 408 on the substrate 404. The purpose of this epitaxial nitride layer 408 is to provide a template for epitaxial growth of GaN. The epitaxial nitride layer 408 in one embodiment is prepared by high-temperature reactive sputtering in a sputtering chamber. The epitaxial nitride layer 408 may also be formed by molecular beam epitaxy (MBE), metal-organic vapor phase epitaxy (MOVPE or MOCVD), hydride vapor phase epitaxy, or high-temperature annealing of the substrate 404 in ammonia. In one example, the thickness of the epitaxial nitride layer 408 is in the range (ranges) from about 0.05 to about 10 microns. In another example, the thickness of the epitaxial nitride layer 408 ranges from about 0.05 to about 2 microns. Other types of template layers may be used, for example, a GaN or AlGaN layer, grown by MOVPE, MBE or HVPE.

The second step of the growth process is to grow a nucleation GaN layer 412 by hydride vapor phase epitaxy in a 3D growth mode with a growth condition that yields a pitted surface morphology. The growth condition for this layer 412 is typically higher growth rate, and/or higher ammonia flow (or V:III ratio), and/or lower growth temperature than the "optimal" thin-film growth condition. The "optimal" thin-film growth condition is one that would produce smooth, substantially pit-free, crack-free, thin films (e.g., with a thickness equal to or less than 3 microns), but would produce microcracked thick films (e.g., with a thickness equal to or greater than 20 microns). As one specific example of an optimized growth condition, a 1-micron thick GaN film that is transparent and has a smooth specular surface has been grown on an AlN-coated sapphire substrate by the inventors. The growth rate was about 60 microns per hour, the GaCl partial pressure was about 3 Torr, the $NH_3$ partial pressure was about 45 Torr, the V:III ratio was about 15, the growth temperature was about 950° C., and the growth time was one minute. When growing a thin film ($\leqq 3$ μm), this "optimal" thin-film growth condition typically produces a crack-free film, whereas when growing a thick film ($\geqq 20$ μm), the "optimal" growth condition typically produces a microcracked film.

There are two purposes for this pitted growth layer 412: first is to prevent microcracking of GaN during the growth, and second is to create in the GaN film a certain stress condition that will facilitate the lateral cracks during cool down. In one example, the thickness of the 3D growth layer 412 may range from about 5 to about 500 microns. In another example, the thickness of the 3D growth layer 412 may range from about 5 to about 200 microns. In another example, the thickness of the 3D growth layer 412 may range from about 5 to about 100 microns. In another example, the thickness of the growth layer 412 ranges from about 10 to about 50 microns. In yet another example, the thickness of the 3D growth layer 412 ranges from about 20 microns to about 30 microns. In another example, the thickness of the 3D growth layer 412 is about 20 microns.

The third step of the growth process is to change the growth conditions to recover the surface morphology from a much pitted surface morphology to a less pitted surface morphology, which prepares the surface of the growing crystal for the subsequent bulk growth stage where most of the GaN crystal is grown. In this third step, the growth mode is gradually changed from a 3D growth mode to a 2D growth mode. This transition is accomplished by growing a recovery layer 416 on the 3D growth layer 412 under conditions such as lower growth rate, and/or lower ammonia partial pressure, and/or higher growth temperature than the growth condition of the 3D nucleation layer 412. In one example, the thickness of the morphology recovery layer 416 may range from about 5 to about 100 microns. In another example, the thickness of the recovery layer 416 ranges from about 5 to about 50 microns. In another example, the thickness of the recovery layer 416 is about 8 microns. The purposes of the recovery layer 416 are to prevent the GaN film from turning into polycrystalline, and to prepare the film with a stress state that facilitates lateral cracks during cool down.

The fourth growth step is the bulk growth step in which the bulk of the GaN film is grown. As illustrated in FIG. 4, a bulk layer or crystal 420 is grown on the recovery layer 416. The growth condition is chosen so that the morphology of the GaN film is slightly pitted or pit-free. The GaN growth mode in this step is substantially a 2D growth mode. The growth conditions may be held constant during this step. Alternatively, the growth condition may be slightly ramped. As examples, the growth condition may entail slightly ramping down ammonia flow, slightly ramping down the growth rate, or slightly ramping up the temperature. The purpose of the ramping in the bulk growth step is to further reduce the density of the pits on the growing GaN surface. During the bulk growth step, the density of the pits on the growing GaN surface is gradually reduced. At the end of the bulk growth, the GaN surface is slightly pitted or pit-free. In one example, the thickness of the GaN bulk layer 420 grown in the bulk growth step ranges from about 500 to about 2000 microns (0.5 to 2 mm) In another example, the thickness of the GaN bulk layer 420 ranges from about 1000 to about 1500 microns (1 to 1.5 mm). In some implementations, the crystal growth process is performed to yield a single wafer. In other implementations, the process may be performed to grow a GaN boule that can be sliced into multiple wafers, in which case a thicker bulk layer 420 may be grown, for example, about 2 mm or greater, from about 2 mm to about 10 mm, or about 10 mm or greater.

After completing the growth, the resulting thick GaN-on-substrate bi-layer is gradually cooled down. In one example, the cooling rate is less than about 20° C. per minute, whereas in another example it is less than about 10° C. per minute. In another example, the rate of cooling is about 6° C. per minute. During this cool-down time, lateral cracking occurs in the GaN film with the crack plane substantially or essentially parallel to the GaN/substrate interface, leading to the separation of GaN from the underlying substrate.

Figure 5:
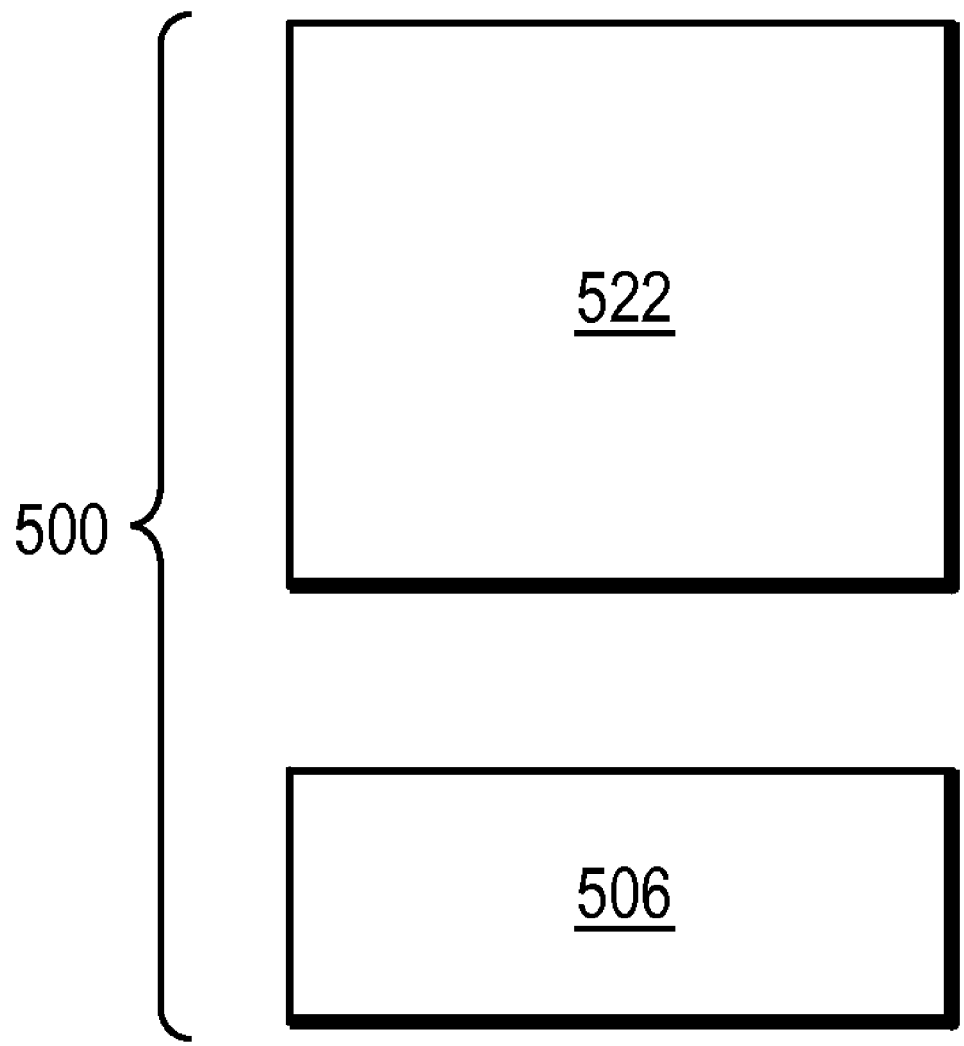
FIG. 5 is a schematic view of the GaN crystal structure illustrated in FIG. 4 after self-separation, yielding a free-standing GaN crystal separate from the underlying substrate.

FIG. 5 illustrates the resulting separated GaN/substrate bi-layer structure 500. A thick GaN wafer 522 having a characteristic dimension (e.g. diameter) as large as the initial substrate 404 (FIG. 4) may be obtained, along with the substrate 506 covered with a thin layer of GaN. As examples, when a 2" substrate 404 is utilized, a 2" GaN wafer 522 may be obtained. When a 3" substrate 404 is utilized, a 3" GaN wafer 522 may be obtained. The substrate 506 may remain intact, or remain partially intact with edge fracture, or fracture into several pieces. The remaining GaN on the substrate 506 is typically less than 500 microns thick. The thickness of the freestanding GaN wafer 522 typically ranges from about 0.5 mm to about 10 mm.

After self-separation, the GaN wafers may be mechanically polished to a specified wafer thickness. To remove the subsurface damage, the wafer may be chemically mechanically polished as the last step. Reactive ion etching or inductively coupled plasma etching may also be used to remove the damaged surface layer. Other suitable surface finishing techniques may alternately or additionally be employed.

When implementing this method, the lateral cracks occur in the GaN/substrate bi-layer structure 500 because it is the most effective way to relieve the thermal stress. We wish not to be bound by any particular theory regarding how the lateral cracks occur, but here we present a possible mechanism by which lateral cracking in the bi-layer structure 500 may occur. Since a substrate material such as sapphire shrinks more than GaN during cool down, the thermal stress condition of the GaN/substrate bi-layer structure 500 results in the substrate being under tensile stress whereas the GaN near the interface is under the compressive stress. Film fracture behavior under compressive stress has been reported in the open literature (see, for example, "Fracture in Thin Films," S. Zuo, *Encyclopedia of Materials: Science and Technology*, Elsevier Science, 2001) and may be used to describe the GaN/substrate system. In accordance with the present method, when a film is under compression, it can self-separate, or debond, from the underlying substrate.

In general, fracture is driven by the relaxation of residual stresses, in this case, thermal stress due to expansion mismatch. Fracture will occur if the driving force exceeds the fracture resistance for the particular fracture mechanism. Cracks can form at pre-existing flaws in the film, in the substrate, or at areas where the resolved stress is concentrated and exceeds the critical fracture value. The mechanics and process of the fracture processes are not fully understood, but under biaxial compressive stress, the in-plane lattice constants a and b of the GaN film are shortened whereas the lattice constant c is elongated. The increased lattice constant c under the biaxial stress weakens the bond strength causing the separation in the c direction, i.e., lateral cracking. This stress may be increased locally by geometric factors.

In the present case, the structure of the as-grown GaN layer(s) leads to conditions conducive to compressive debonding at or near the interface between the GaN and substrate. The epitaxial nitride (e.g., AlN) layer, the first GaN nucleation step, the second GaN nucleation step, or some combination of the three, results in the initiation of the debonding behavior during cool down. Experimentally, the initial debonding has been observed to occur near the center of the substrate bi-layer. After debonding, buckling occurs as the self-separated area increases. As the elastic constants of the GaN and the substrate (e.g., sapphire) are close in magnitude and plastic deformation is extremely small, the degree of buckling is limited. After buckling, both normal and shear stresses develop that will continue to grow the debonded area like a crack. Under preferred conditions, the debonding continues to the edge of the GaN/substrate bi-layer and separates the GaN layer from the substrate.

There are three major competing processes that have also been observed for the relief of the thermal stress in the GaN/substrate bi-layer: (1) lateral cracking in the GaN layer due to compressive stress in the GaN layer near the GaN/substrate interface, to form a whole piece of thick stress-free GaN wafer and a thinner-GaN/substrate bi-layer, (2) vertical cracks in sapphire due to tensile stress developed during cool down (the vertical cracks may also propagate to GaN), and (3) the presence of both lateral cracking in GaN and vertical cracking in substrate and GaN. A crack will occur in the direction where the stress exceeds the critical stress.

In addition to the thermal stress during cool down, the GaN/substrate bi-layer also experiences a growth stress built up during the crystal growth. The growth stress can lead to GaN microcracks under certain growth conditions as discussed in the previous paragraphs. The growth stress can also lead to the breaking of the substrate and the GaN layer during the growth, which is observed under non-optimal growth conditions.

The growth sequence employed prepares in the GaN layer a certain stress state during the growth, such as increased compressive stress in the GaN layer near the interface or reduced tensile stress on the substrate, enabling the compressive stress debonding during cool down while preventing growth stress leading to microcracking or vertical cracking in the substrate or GaN layer, yielding a freestanding GaN substrate. The formation of the 3D nucleation layer is one key aspect for the separation of the bulk GaN layer during cool down. If the first nucleation layer is grown under conditions of 2D growth, the most likely mechanism for thermal stress relief for the thick GaN/substrate bi-layer is vertical cracking in the substrate that propagates to the GaN layer.

Figure 6:
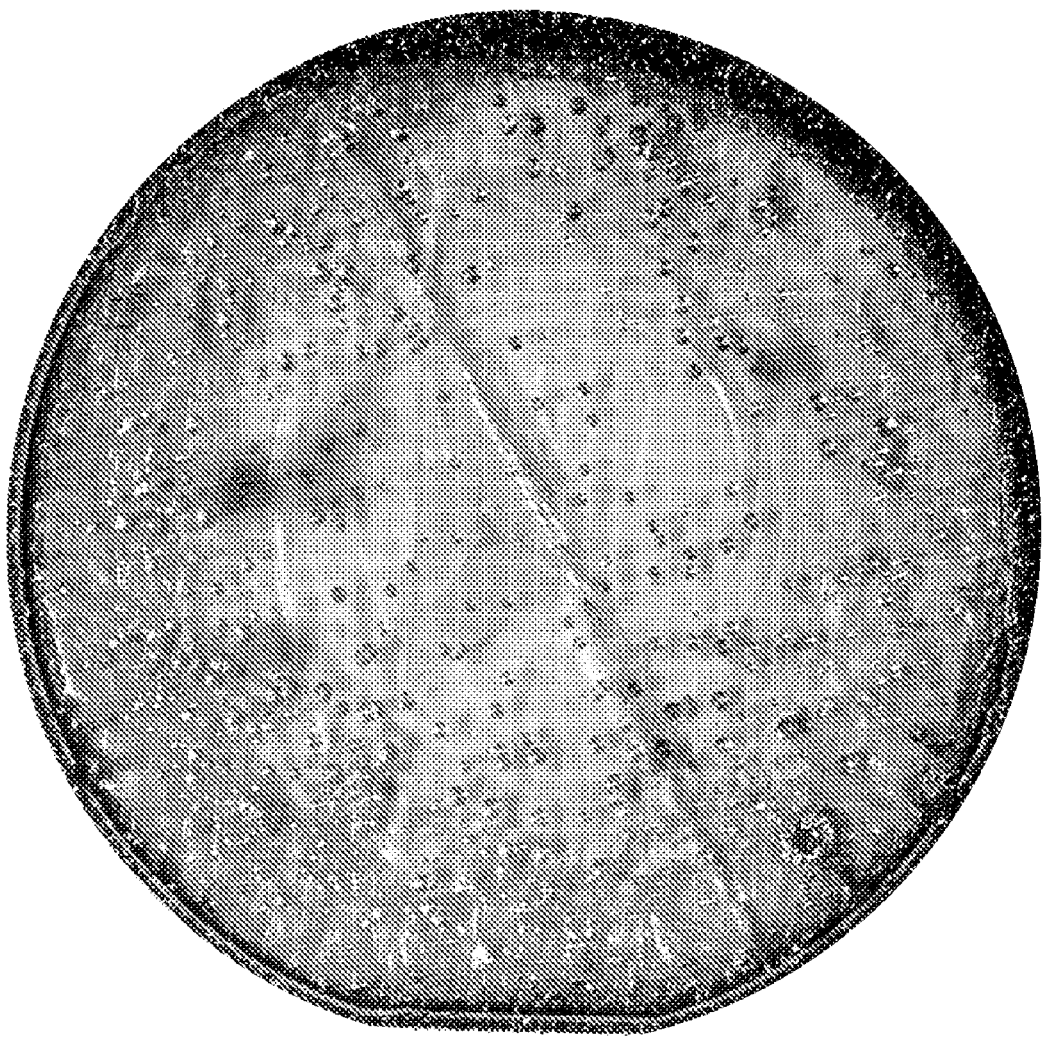
FIG. 6 is an optical image of an as-grown 3" GaN substrate grown with a semi-insulating growth scheme described below.

Semi-insulating GaN substrates may be made with this method when deep-level impurities are introduced during the growth process. An iron impurity, for example, may be introduced into the reactor vessel by using a suitable iron source such as, for example, ferrocene (bis(cyclopentadienyl)iron). FIG. 6 is an optical picture of an as-grown iron-doped GaN substrate grown with the method disclosed in U.S. Prov. Pat. App. Ser. No. 60/750,982, discussed above.

Figure 7:
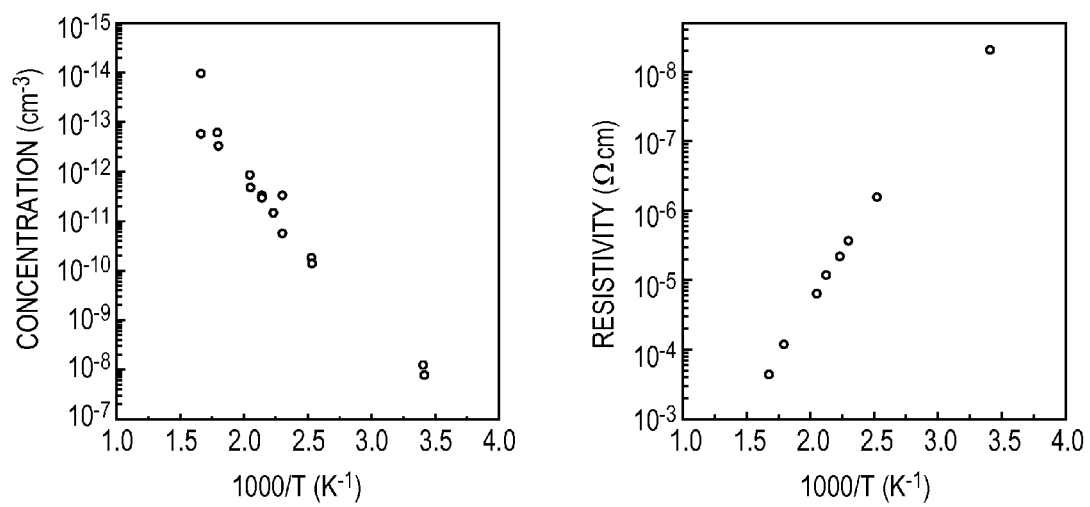
FIG. 7 is a plot of carrier concentration data (left) and Hall resistivity data (right) for a wafer created with the semi-insulating growth scheme that shows high resistivity (>1E8 ohm-cm) at room temperature.
Figure 8:
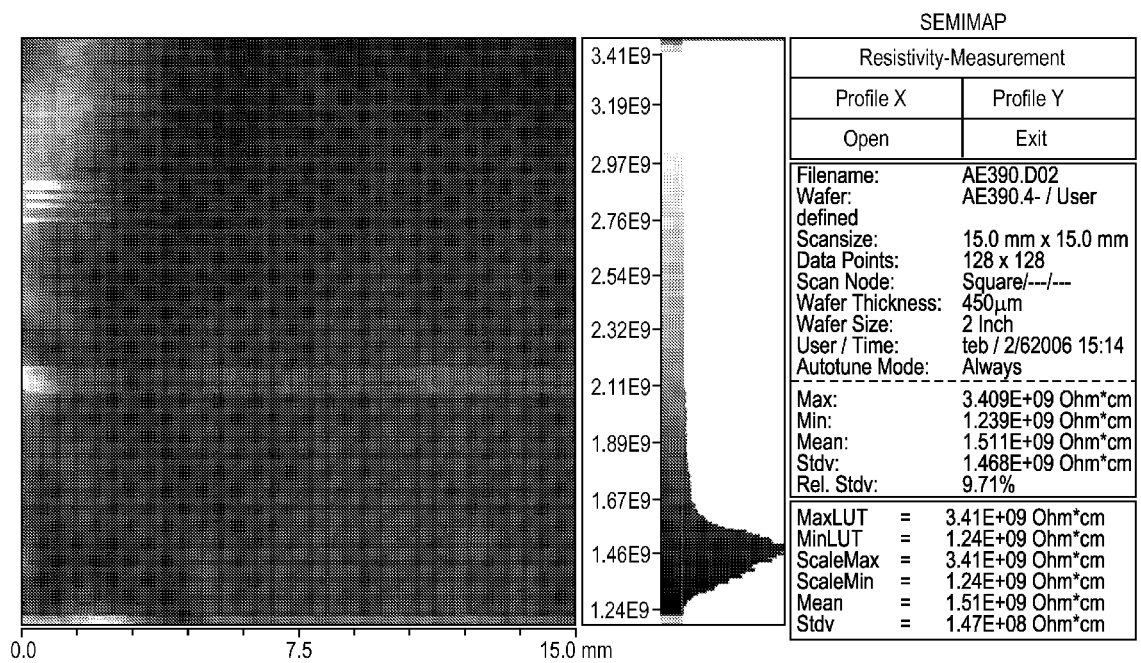
FIG. 8 is a room temperature COREMA resistivity map of a semi-insulating GaN substrate. The mean resistivity of the substrate is $1.51 \times 10^9$ Ω·cm.

The iron-doped GaN is semi-insulating as measured with contactless resistivity mapping (COREMA) and Hall measurement techniques. A 10 mm×10 mm polished GaN wafer was obtained from the wafer and the resistivity of the piece was measured. FIG. 7 shows the Hall resistivity and carrier concentration as a function of temperature. The room temperature resistivity of the sample was greater than about $2 \times 10^8$ ohm-cm. FIG. 8 is a COREMA resistivity map of a 10 mm×10 mm GaN substrate obtained from the iron-doped GaN wafer. The mean room temperature resistivity was about $1 \times 10^9$ ohm-cm and the minimum resistivity measured on the sample was about $5 \times 10^8$ ohm-cm.

Figure 9:
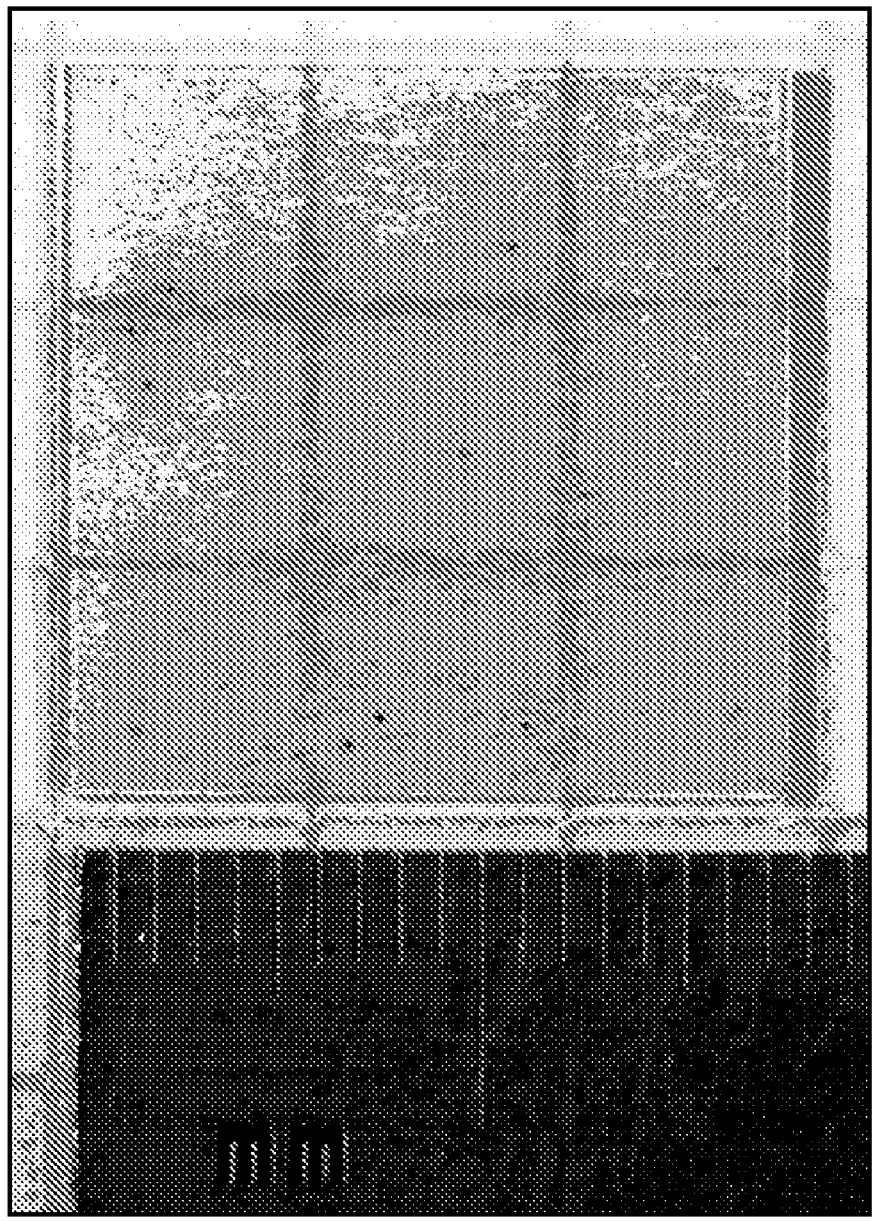
FIG. 9 is a photograph of an iron-doped GaN wafer showing a few brown inclusions.

The GaN obtained with the method disclosed in U.S. Prov. Pat. App. Ser. No. 60/750,982 still has a few pits as shown in FIG. 6. These pits may be removed by mechanically grinding or lapping away the surrounding materials and polishing the surface to a mirror finish. FIG. 9 shows a photograph of a polished GaN wafer, showing some inclusions of brown or darker materials in the wafer. The brown inclusions correspond to the areas where pits were present prior to the polishing. The inclusions are still single-crystal gallium nitride, but with different impurity levels, in particular, with higher oxygen impurity in the inclusion than the surrounding area.

The resistivity of the iron-doped GaN wafers with a few brown inclusions were measured with Hall and COREMA methods, and were found be semi-insulating (above $1 \times 10^8$ ohm-cm). The resistivity of the wafers was also measured with the Lehighton method using a LEI 1500 sheet resistance mapping system manufactured by Lehighton Electronics, Inc. The Lehighton method is a known method for measuring the sheet resistance of semi-insulating wafers, such as semi-insulating GaAs. When the sheet resistance of a wafer above $1 \times 10^5$ ohm is measured with the Lehighton method, it is considered off-scale for the Lehighton measurement, and the wafer is considered as semi-insulating. We measured a set of polished wafers that contained a few brown inclusions with the Lehighton method and found that typical sheet resistance was between 50 and 5000 ohm/sq, and resistivity was between 2.5 and 250 ohm-cm, much lower than the value obtained with Hall and COREMA measurements.

The discrepancy between the Lehighton measurement and the COREMA measurement may be explained by the physical nature of the measurement techniques. The Lehighton measurement is based on eddy current and measures the sampling area in parallel, whereas the COREMA measurement is based on capacitance and measures the sampling area in series. If the resistivity within the sampling area is not uniform, the resistivity data obtained by the Lehighton technique will be dominated by the low-resistivity area, whereas the resistivity data obtained by COREMA measurement will be dominated by the high-resistivity area. The brown spots (inclusions) have higher donor impurity concentration and lower resistivity. The inclusion of low-resistivity material reduces performance and yield of the electronic devices grown on the substrate.

Methods for Producing Inclusion-Free Uniform Semi-Insulating GaN

The present invention discloses methods for producing uniform semi-insulating gallium nitride, without inclusion of conductive spots. In one aspect of the present invention, the morphology of the growth surface is essentially pit-free during the HVPE growth of semi-insulating GaN on c-plane substrate. The presence of pits during the SI GaN growth is the source of the inclusion of conductive spots. The elimination of the pits during the growth eliminates the conductive spots in the SI GaN substrates.

In one implementation, the uniform semi-insulating GaN without inclusion of conductive spots is made from HVPE GaN growth on a sapphire substrate. The growth process is similar to the process disclosed in U.S. Prov. Pat. App. Ser. No. 60/750,982, but with improvements that ensure complete elimination of pits during the later stage of the growth. The present method will be described by referring again to FIGS. 4 and 5.

First, a suitable substrate 404 is provided. In some implementations, the substrate 404 may have a characteristic dimension (e.g., diameter) of about 2 inches or greater. As further examples, the diameter of the substrate 404 may be about 3" or greater, about 4" or greater, or any other suitable size such as about 12" or greater. The substrate 404 may be sapphire ($Al_2O_3$), although other suitable single-crystal substrates 404 may be utilized.

The surface of the substrate 404 may be exactly c-plane or vicinal surfaces of the c-plane. Vicinal surfaces may promote step-flow during the HVPE GaN growth and may yield smoother surface morphology. The offcut angle of the vicinal surface with respect to the c-plane is in one example between about 0.1° and about 10°, and in another example between about 0.5° and about 5°. The direction of offcut may be along the <1-100> direction or along the <11-20> direction, or along a direction between <1-100> and <11-20>.

An epitaxial nitride (e.g., AlN) layer 408 is then deposited on the substrate 404. The purpose of this epitaxial nitride layer 408 is to provide a template for epitaxial growth of GaN. The deposition of epitaxial nitride layer 408 may be done in the same reactor as for the subsequent GaN growth, or in a different deposition chamber. In one implementation, the epitaxial nitride layer 408 is deposited by reactive sputtering on a heated substrate in a sputter deposition chamber. The nitride-coated substrate 404/408 is subsequently removed from the sputter chamber and loaded into the HVPE reactor for GaN growth. Other nitride layers such as, for example, AlN grown by MOCVD or MBE, GaN grown by MOCVD or MBE, AlGaN grown by MOCVD or MBE, or the like may also be used. In some implementations, a reactive sputtering-deposited AlN layer has an advantage of lower cost than MOCVD- or MBE-deposited nitride layers. AlN layers may also be grown in the HVPE reactor by incorporating an Al source so that hydrochloric acid reacts with Al to form aluminum chloride, which reacts with ammonia in the deposition zone to form AlN on the substrate surface. In one example, the thickness of the epitaxial nitride layer 408 is in the range (ranges) from about 0.01 to about 2 microns. In another example, the thickness of the epitaxial nitride layer 408 ranges from about 0.05 to about 10 microns. In another example, the thickness of the epitaxial nitride layer 408 ranges from about 0.05 to about 2 microns. In another example, the thickness of the epitaxial nitride layer 408 ranges from about 0.2 to about 2 microns.

In some implementations, depending on such factors as process conditions and the specific reactor being employed, the deposition of the epitaxial nitride layer 408 may be desirable for growing single-crystal GaN films on sapphire substrates using the HVPE process. In other HVPE reactor systems, however, the single-crystalline GaN layer 412 may be grown directly on the substrate 404 by HVPE without using a template layer such as the epitaxial nitride layer 408 prior to HVPE growth. In such cases, the growth sequence according to the teaching of the present invention can skip the nitride-coating step and proceed directly to the next growth step.

The second step of the growth process is to grow an epitaxial GaN layer 412 via 3D growth mode by hydride vapor phase epitaxy with a growth condition that yields a pitted surface morphology. The uncoated substrate 404 or nitride-coated substrate 404/408 is loaded into an HVPE reactor, and the reactor may be purged with high-purity nitrogen to remove impurities. An epitaxial layer 412 of gallium nitride is then grown. This GaN layer 412 is grown in a three-dimensional (3D) growth mode, where the surface of the film is very rough and covered with pits. The purpose of this single-crystal but pitted GaN layer 412 is to prevent future microcracking during growth. Without this pitted, rough GaN layer 412, a smooth GaN layer grown on an AlN-coated sapphire substrate typically microcracks when the thickness of the smooth layer is greater than about 20 microns. The growth condition for the pitted layer 412 is typically a higher growth rate, and/or higher ammonia flow (or V:III ratio), and/or lower growth temperature than the "optimal" thin-film growth condition that would produce a smooth surface morphology.

In one example, the thickness of the 3D growth layer 412 ranges from about 5 to about 100 microns. In another example, the thickness of the 3D growth layer 412 ranges from about 10 to about 50 microns. In another example, the thickness of the 3D growth layer 412 ranges from about 20 to about 30 microns. In another example, the thickness of the 3D growth layer 412 is about 20 microns. The surface coverage of pits, which is defined as the percentage of the area covered with pits over the total c-plane growth area, is in one example greater than about 50%, in another example greater than about 75%, and in another example greater than about 90% at the end of this step. The distribution of pits, i.e., the size of pits and the depth of pits, is preferably a normal distribution. The aspect ratio of the pits, defined as the depth of the pit divided by the diameter of the pit, is in some implementations preferred to be a constant. Additional gaseous hydrochloric acid that does not go through the gallium metal (i.e., does not produce GaCl) may be added to the reactor and the flow rate of the gas controlled to achieve a constant aspect ratio of the pits. A deep-level compensating dopant, such as iron, may be optionally introduced in this step.

In one implementation, the growth temperature in the 3D growth mode ranges from about 900° C. to about 1000° C., the V:III ratio in the 3D growth mode ranges from about 10 to about 100, and the growth rate in the 3D growth mode ranges from about 50 µm/hr to about 500 µm/hr.

The third step of the growth process changes the HVPE growth conditions to transition the surface morphology from a heavily pitted surface morphology to a gradually less pitted surface morphology. The transition layer 416 is grown under conditions such as lower growth rate, and/or lower ammonia flow, and/or higher growth temperature than the growth condition of the 3D nucleation layer 412. In one example, the thickness of this morphology transition layer 416 ranges from about 5 to about 500 microns. In another example, the thickness of the transition layer 416 ranges from about 10 to about 200 microns. The purposes of the transition layer 416 are to prevent the GaN film from turning polycrystalline, and to prepare the film with a stress state that facilitates the formation of lateral cracks during cool-down.

At the end of growth of the transitional layer 416, the growth surface is substantially pit-free. Because nucleation growth conditions are used in the second step that yield pits with preferably uniform characteristics, such as same aspect ratio and crystal orientations of the faces of the pits, most pits can be closed during the growth of the transitional layer 416. The surface coverage of pits at the end of growth of the transitional layer 416 is in one example less than about 10%, in another example less than about 5%, and in another example less than about 1%. Deep-level compensating doping, such as with iron, may be introduced in this step. Iron doping may be achieved, for example, by introduction of a volatile metal organic compound such as ferrocene into the reactor.

In one implementation, the growth temperature in the transitional layer growth mode ranges from about 920° C. to about 1100° C., the V:III ratio in the transitional layer growth mode ranges from about 8 to about 80, and the growth rate in the transitional layer growth mode ranges from about 50 µm/hr to about 500 µm/hr.

The fourth growth step is the bulk growth step where the bulk of the GaN film is grown. As illustrated in FIG. 4, a bulk layer or crystal 420 is grown on the transition layer 416. The growth condition is chosen to further eliminate any remaining pits so that the morphology of the GaN film is essentially pit-free and the GaN growth mode in this step is substantially a 2D growth mode. The bulk growth conditions may be lower ammonia flow and/or higher growth temperature than employed during the transitional layer step. At the end of the bulk growth, the GaN surface is essentially pit-free. The density of surface pits at the end of bulk growth is in one example less than about 5 cm$^{-2}$, in another example less than about 1 cm$^{-2}$, and in another example about 0 cm$^{-2}$. The thickness of the GaN grown in the fourth bulk growth step in one example ranges from about 500 to about 2000 microns (about 0.5 to about 2 mm), and in another example ranges from about 1000 to about 1500 microns (about 1 to about 1.5 mm). Deep-level compensating doping, such as iron, may be introduced in this step. Iron doping may be achieved, for example, by introduction of a volatile metal organic compound such as ferrocene into the reactor.

In one implementation, the growth temperature during the bulk growth step ranges from about 950° C. to about 1100° C., the V:III ratio during the bulk growth step ranges from about 5 to about 50, and the growth rate during the bulk growth step ranges from about 50 µm/hr to about 500 µm/hr.

Referring to FIG. 5, after completing the growth, the thick GaN-on-substrate bi-layer 500 is gradually cooled down. The cooling rate is in one example less than about 20° C. per minute, and in another example less than about 10° C. per minute. In another example, the rate of cooling is about 6° C. per minute. During this cool down time, lateral cracking occurs in the GaN film with the crack plane essentially parallel to the GaN/sapphire interface, leading to the separation of GaN from the underlying substrate. A thick GaN article or wafer 522 having a characteristic dimension (e.g., diameter) as large as the initial substrate 404 (FIG. 4) may be obtained, along with the substrate 506 covered with a thin layer of GaN. For instance, when a 2" substrate 404 is utilized, a 2" GaN article 522 may be obtained. When a 3" substrate 404 is utilized, a 3" GaN article 522 may be obtained. In some examples, the GaN article 522 may be broken into several large pieces during cool down, in which case large pieces may be sized into desired wafer shapes such as a circle (optionally with flat) or rectangle (optionally with flat).

The thick, freestanding GaN wafers 522 may be further processed into uniform semi-insulating GaN wafers by using lapping, polishing and chemical mechanical polishing. Because the GaN layer 420 was first grown with a pitted surface morphology which has more oxygen incorporation and thus lower resistivity on the backside, the more conductive layer near the backside of the article 522 may be completely removed to ensure the semi-insulating nature of the wafer. In one example, the freestanding GaN article 522 is first sized into a desired wafer shape (herein defined as a wafer blank), optionally with major and minor flats to indicate the crystal orientation of the substrate. In one example, the sized GaN wafer blank is about 10 mm×10 mm square or greater—i.e., the sized GaN wafer blank includes a side having a length of about 10 mm or greater. In another example, the sized GaN wafer blank is about 18 mm×18 mm square. In another example, the sized GaN wafer blank is about 1 inch round or greater—i.e., the sized GaN wafer blank is circular and has a diameter of about 1 inch or greater. In another example, the sized GaN wafer blank is about 2 inches round or greater. The front of the wafer blank is the Ga-face and the back of the wafer blank is the nitrogen-face of the single-crystalline GaN. Material may be removed from the back side of the wafer blank by mechanical means such as grinding and/or lapping. The thickness removed from the back side of the wafer blank may be at least as much as or greater than the thickness of the grown transitional layer. The front side (Ga face) may be further polished with diamond slurry. The Ga-surface may be finished with a chemical-mechanical polish step that removes the surface and subsurface damage and produces an epi-ready surface. The back side of the wafer blank may be processed by mechanical means such as grinding or lapping to planarize (mechanically flatten) the surface and to achieve the desired wafer thickness. Since the crystal defect density is reduced during the growth of single-crystalline GaN, it may be preferable to take away material from the back side to achieve the desired wafer thickness. Optionally, the back side may be polished to produce an optical finish.

Figure 10:
FIG. 10 is a photograph of an inclusion-free semi-insulating GaN wafer obtained according to one implementation of the present invention.

FIG. 10 shows a photograph of an inclusion-free uniform semi-insulating GaN wafer produced according to one implementation of the invention. No brown inclusion is present on the wafer. Lehighton resistivity mapping measurement of the wafers produced with the methods described in this disclosure shows that the sheet resistance of the wafer is off-scale of the instrument, and thus the wafers are semi-insulating in nature.

In another implementation of the present invention, a native GaN seed is utilized for making inclusion-free semi-insulating GaN wafers. The c-plane GaN seed wafer is chemical-mechanically polished to remove any residual surface and subsurface damage from the mechanical polish process. After a thorough cleaning of the seed wafer, it is loaded into a HVPE reactor. Gallium nitride film is grown on the GaN seed by the HVPE process. Ferrocene as an iron-doping source is introduced for yielding semi-insulating GaN. The growth condition is chosen to ensure that the surface of the growing GaN crystal (growth surface) remains pit-free during the entire growth process. Typical growth conditions for this implementation are: growth rate about 100-400 microns per hour, growth temperature about 950-1050° C., $NH_3$/GaCl (V/III) ratio about 5-50, and reactor pressure about 100-760 Torr. It will be understood, however, that the various growth conditions are not limited to the foregoing ranges. The exact conditions for the growth depend on the reactor configuration, and may be determined by those who are familiar with the art. An aspect of the invention is to maintain the growth surface and morphology pit-free during the entire growth process. Under a condition of lower temperature and/or higher V/III ratio than the optimal growth condition window, pits can be formed on the growth surface, which is undesirable. The iron-doped GaN crystal is grown on the GaN seed crystal by hydride vapor phase epitaxy under optimal growth conditions that maintain the pit-free growth surface morphology. In one example, the length of the grown GaN crystal is about 1 mm or greater. In another example, the length of the GaN crystal is about 5 mm or greater. In another example, the length of the GaN crystal is about 1 cm or greater. The grown GaN crystal may be sliced into multiple wafers, which may be further processed into epi-ready GaN wafers by mechanical and chemical-mechanical polishing. The density of the brown spot inclusion is minimal. In one example, the density of the brown spot inclusion is equal to or less than about 1 $cm^{-2}$. In another example, the density of the brown spot inclusion is about 0 $cm^{-2}$.

In conjunction with the above-described implementations, the iron doping level in the iron-doped semi-insulating GaN crystal may be controlled by the partial pressure of the volatile iron compound in the gas flow. When ferrocene is used as the iron source, the amount of ferrocene transported from the ferrocene bubbler to the reactor is determined by the bubbler temperature and carrier gas flow. In general, the higher concentration of the volatile iron compound in the gas phase corresponds to a higher concentration of iron in the grown GaN crystal. The exact relationship between the iron concentration in the GaN crystal and the flow of iron compound depends on the reactor configuration, and can be determined by those skilled in the art. The iron concentration should be higher than the total concentration of n-type impurities and defects. In one example, the iron concentration ranges from about $10^{16}$ to about $10^{19}$ $cm^{-3}$. The iron-doped GaN is semi-insulating. In one example, the resistivity is greater than about $1 \times 10^7$ ohm-cm.

Other deep-level acceptors may alternatively be introduced into the gallium nitride crystal by using proper precursors. For instance, transition metals (e.g., Fe, Ni, Co, Mn, Cr, etc.) may be introduced into the HVPE reactor by the respective metal-organics, or by reacting the respective metal element with gaseous hydrochloric acid.

The n-type impurities such as silicon and oxygen in the GaN crystal should be reduced to a minimum. Some precautionary steps may be used to reduce oxygen impurities in the GaN crystal grown by HVPE methods. The reactor should be leak-tight. A sufficient purge time should be allowed after loading the substrate into the reactor and prior to crystal growth. A load-lock system may be employed for the substrate loading to prevent the exposure of the reactor interior to the ambient air during loading of the substrate. Purification of gas sources to remove oxygen impurities may be implemented. In one example, the concentration of n-type impurities is less than about $10^{17}$ $cm^{-3}$, in another example less than about $5 \times 10^{16}$ $cm^{-3}$, and in another example less than about $10^{16}$ $cm^{-3}$.

Certain implementations of the present invention may be further understood by following illustrative, non-limiting example.

Example

Semi-Insulating GaN Growth

In this example, we illustrate a method for making an inclusion-free uniform semi-insulating GaN substrate. Sapphire(0001) was used as the starting substrate. An AlN layer approximately 0.25 μm thick was grown on the sapphire substrate by carrying out reactive sputtering on the heated substrate. X-ray diffraction was used to verify the AlN film was single-crystal with full width at half maximum (FWHM) of 55 arcsec. The AlN/sapphire structure was loaded into the previously described vertical HVPE system 100 (FIG. 1) and the GaN growth was commenced.

The HVPE GaN film was grown by a multiple-step method. The GaN film was first grown under conditions of growth rate of approximately 260 microns per hour, growth temperature of 968° C., HCl flow rate of 92 sccm, and $NH_3$ flow rate of 2000 sccm. This layer was grown on the AlN-coated surface under a 3D growth mode. The growth time for the nucleation layer was approximately 4 minutes and the thickness of this layer was approximately 18 microns. In some runs, the growth was stopped at this point, and the wafer was taken out of the reactor for examination. The wafer surface was visually not specular, and appeared rough. Under microscope examination, the surface was covered with a high density of pits.

After growth of the nucleation layer, the growth rate was reduced to approximately 65 microns per hour by reducing HCl flow to 23 sccm while keeping the same $NH_3$ flow and growth temperature. After growth for approximately 7 minutes under these conditions, the HCl flow was increased to 46 sccm, the $NH_3$ flow was reduced to 1500 sccm and growth temperature was raised by 15° C. to 983° C. for approximately 1 hour. These two growth conditions were considered as the transitional layer growth stage where surface morphology was improved with less pits. Ferrocene was introduced in the growth system with a nitrogen carrier gas flow of 200 sccm. In some runs, the growth was stopped at this point and the wafer was taken out of the reactor for examination. The wafer surface was visually specular and smooth. A few pits still remained, but the percentage of the surface covered by pits was less than 1%. The growth mode was transitioned from the 3D mode of the nucleation to a 2D growth mode during this step.

After the growth of the transitional layer, the $NH_3$ flow was further reduced to 900 sccm for an additional growth time of 7 hours. Ferrocene was introduced in the growth system with a nitrogen carrier gas flow of 200 sccm. This was the bulk growth step.

Figure 11:
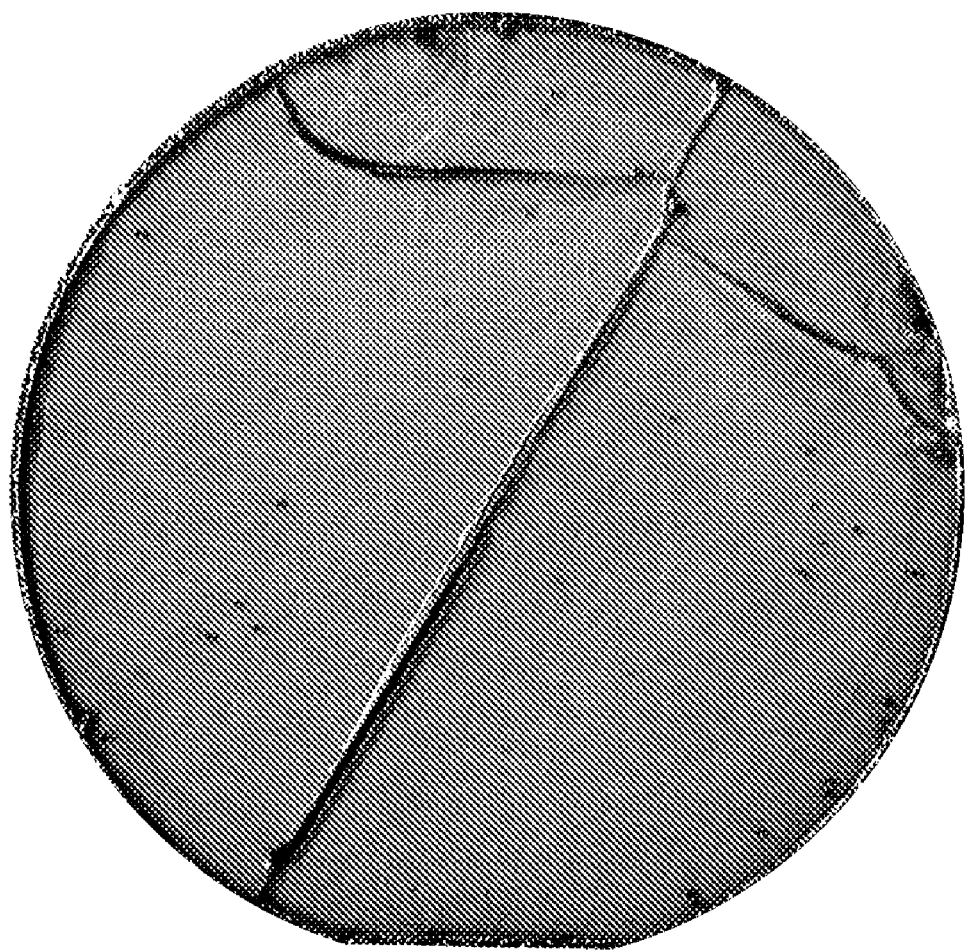
FIG. 11 is a photograph of 2" freestanding substrate separated from sapphire after cooling from the growth temperature.

After completion of the growth sequence, the resulting GaN/sapphire bi-layer was cooled to room temperature at a cooling rate of approximately 6° C. per minute. During the cooling process, the sapphire substrate completely delaminated from the GaN/sapphire bi-layer, thereby forming a freestanding GaN substrate. FIG. 11 is an optical picture of the GaN substrate obtained in this example. The GaN substrate was 2 inches in diameter and the thickness of the substrate was approximately 1.2 mm. The wafer was broken into two large pieces during the separation process. The surface was almost pit-free, which is a significant improvement when compared to the wafer in FIG. 6 obtained using the method of U.S. Prov. Pat. App. Ser. No. 60/750,982.

The as-grown freestanding GaN was cut into 18×18 mm and 10×10 mm wafers. The front surface (Ga-face) was lightly ground to even the surface and approximately 700 microns of the back side was ground away to eliminate any potential conductive layer. The front side was further polished with a diamond slurry that had diamond particles of approximately 2-4 microns in diameter. The GaN was finished with a chemical mechanical polishing process to remove any surface and subsurface damage. The finished wafer was approximately 500 microns thick. FIG. 10 is a photograph of a 18×18 mm inclusion-free substrate obtained in this example.

The crystal defect density was analyzed by etching with phosphoric acid heated to approximately 240° C. to create etch pits and the density of the etch pits was measured with an atomic force microscope. The etch pit density, which corresponds to the threading dislocation density, was approximately $5 \times 10^6$ $cm^{-2}$ for the wafers obtained in this example.

The electric property of the wafers was measured with contactless resistivity mapping (COREMA) and Lehighton techniques. The room temperature resistivity of the sample was greater than $2 \times 10^8$ ohm-cm based on COREMA measurement. The sheet resistance of the wafer was greater than $1 \times 10^5$ ohm/square based on Lehighton measurements. Both techniques showed uniform resistive electric properties within the spatial resolution of the instruments. The wafers obtained in this example were uniformly semi-insulating, and were absent of brown spot inclusions. On the other hand, wafers obtained using the method of U.S. Prov. Pat. App. Ser. No. 60/750,982 had inclusion of brown spots and a sheet resistance of less than 1000 ohm/square measured by the Lehighton method, although COREMA measurements showed resistivity greater than $2 \times 10^8$ ohm-cm.

It will be apparent to those skilled in the art that various modifications and variations can be made in the growth of the inclusion-free uniform semi-insulating GaN crystal within the spirit of scope of the present invention. Thus it is construed that the present invention covers the variations and modifications of this invention provided they come within the scope of the appended claims and their equivalent.

What is claimed is:

1. A method of forming a GaN crystal, the method comprising:
    forming a single-crystalline GaN nucleation layer over a substrate in a substantially three-dimensional growth mode, such that a surface of the nucleation layer comprises a plurality of pits each having substantially the same aspect ratio;
    forming a single-crystalline GaN transition layer over the nucleation layer, a growth mode of the transition layer changing from substantially three-dimensional to substantially two-dimensional during formation of the transition layer, such that a surface of the transition layer is substantially free of pits; and
    forming a single-crystalline GaN bulk layer over the transition layer in a substantially two-dimensional growth mode, such that a surface of the bulk layer is substantially free of pits.

2. The method of claim 1, further comprising, prior to forming the nucleation layer, forming an epitaxial nitride layer over the substrate.

3. The method of claim 1, further comprising doping at least one of the nucleation layer, the transition layer, or the bulk layer with a transition metal.

4. The method of claim 1, wherein forming the nucleation layer comprises introducing HCl that does not flow through a Ga precursor.

5. The method of claim 1, wherein the substrate comprises sapphire.

6. The method of claim 1, wherein at least one of the nucleation layer, the transition layer, or the bulk layer are formed by hydride vapor phase epitaxy.

7. The method of claim 1, further comprising, after forming the bulk layer, cooling the substrate such that cracks form in at least one of the nucleation layer or the transition layer, and the bulk layer separates from the substrate.

8. The method of claim 1, wherein, following formation of the bulk layer, at least a portion of the bulk layer is semi-insulating and substantially free of inclusions.

9. The method of claim 2, wherein the epitaxial nitride layer is formed by sputtering.

10. The method of claim 2, wherein the epitaxial nitride layer comprises AlN.

11. The method of claim 3, wherein the transition metal comprises at least one of Fe, Ni, Co, Mn, or Cr.

12. The method of claim 7, wherein the cooling is performed at a cooling rate of less than approximately 20° C. per minute.

* * * * *